US011755900B2

(12) United States Patent
Lee et al.

(10) Patent No.: US 11,755,900 B2
(45) Date of Patent: Sep. 12, 2023

(54) PROCESSING DEVICE BASED ON MAGNETIC TUNNEL JUNCTION (MTJ) ELEMENT AND ELECTRONIC SYSTEM INCLUDING THE PROCESSING DEVICE

(71) Applicant: Samsung Electronics Co., Ltd., Suwon-si (KR)

(72) Inventors: Kangho Lee, Seongnam-si (KR); Boyoung Seo, Suwon-si (KR); Sangjoon Kim, Hwaseong-si (KR); Seungchul Jung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 168 days.

(21) Appl. No.: 17/474,466

(22) Filed: Sep. 14, 2021

(65) Prior Publication Data
US 2022/0261625 A1    Aug. 18, 2022

(30) Foreign Application Priority Data

Feb. 15, 2021 (KR) .................. 10-2021-0019998

(51) Int. Cl.
*G06N 3/065* (2023.01)
*G11C 11/16* (2006.01)

(52) U.S. Cl.
CPC ............ *G06N 3/065* (2023.01); *G11C 11/161* (2013.01); *G11C 11/1655* (2013.01); *G11C 11/1673* (2013.01); *G11C 11/1675* (2013.01); *G11C 11/1657* (2013.01)

(58) Field of Classification Search
None
See application file for complete search history.

(56) References Cited

U.S. PATENT DOCUMENTS

| 7,095,647 | B1* | 8/2006 | Jenne ...................... G11C 11/16 |
| | | | 365/158 |
| 7,272,035 | B1* | 9/2007 | Chen ....................... G11C 11/16 |
| | | | 365/158 |
| 7,646,041 | B2 | 1/2010 | Chae et al. |
| 7,755,077 | B2 | 7/2010 | Inaba |
| 8,264,052 | B2 | 9/2012 | Xia |
| 9,548,096 | B1 | 1/2017 | Li et al. |
| 10,089,577 | B2 | 10/2018 | Umuroglu et al. |

(Continued)

FOREIGN PATENT DOCUMENTS

CN    111489777 A    8/2020

*Primary Examiner* — J. H. Hur
(74) *Attorney, Agent, or Firm* — HARNESS, DICKEY & PIERCE, P.L.C.

(57) ABSTRACT

Provided is a processing device having improved reliability and power consumption efficiency of analog calculations as well as high cost efficiency due to reduction in a size of a bit-cell, and an electronic system including the processing device. The processing device includes: at least one bit-cell line on which a plurality of bit-cells are connected to each other in series, wherein each of the bit-cells includes: a first magnetic tunnel junction (MTJ) element; a second MTJ element connected to the first MTJ element in parallel; a first switching element connected to the first MTJ element in series; and a second switching element connected to the second MTJ element in series, and wherein on the bit-cell line, two adjacent bit-cells are connected to each other in series in a mirroring structure.

20 Claims, 22 Drawing Sheets

(56) References Cited

U.S. PATENT DOCUMENTS

| | | | |
|---|---|---|---|
| 11,514,963 B2* | 11/2022 | Drouard | G11C 11/18 |
| 2006/0209585 A1* | 9/2006 | Tanizaki | G11C 13/004 |
| | | | 365/148 |
| 2007/0206406 A1* | 9/2007 | Ueda | G11C 11/16 |
| | | | 365/158 |
| 2007/0247893 A1* | 10/2007 | Bednorz | G11C 11/1657 |
| | | | 365/148 |
| 2009/0014703 A1* | 1/2009 | Inaba | B82Y 10/00 |
| | | | 257/E47.001 |
| 2009/0161413 A1* | 6/2009 | Yoon | G11C 11/1675 |
| | | | 365/158 |
| 2019/0131977 A1 | 5/2019 | Obradovic et al. | |
| 2020/0005844 A1* | 1/2020 | Alhalabi | G11C 11/1675 |
| 2022/0019885 A1* | 1/2022 | Jung | H10B 61/22 |
| 2022/0051717 A1* | 2/2022 | Lee | G11C 13/0026 |

* cited by examiner

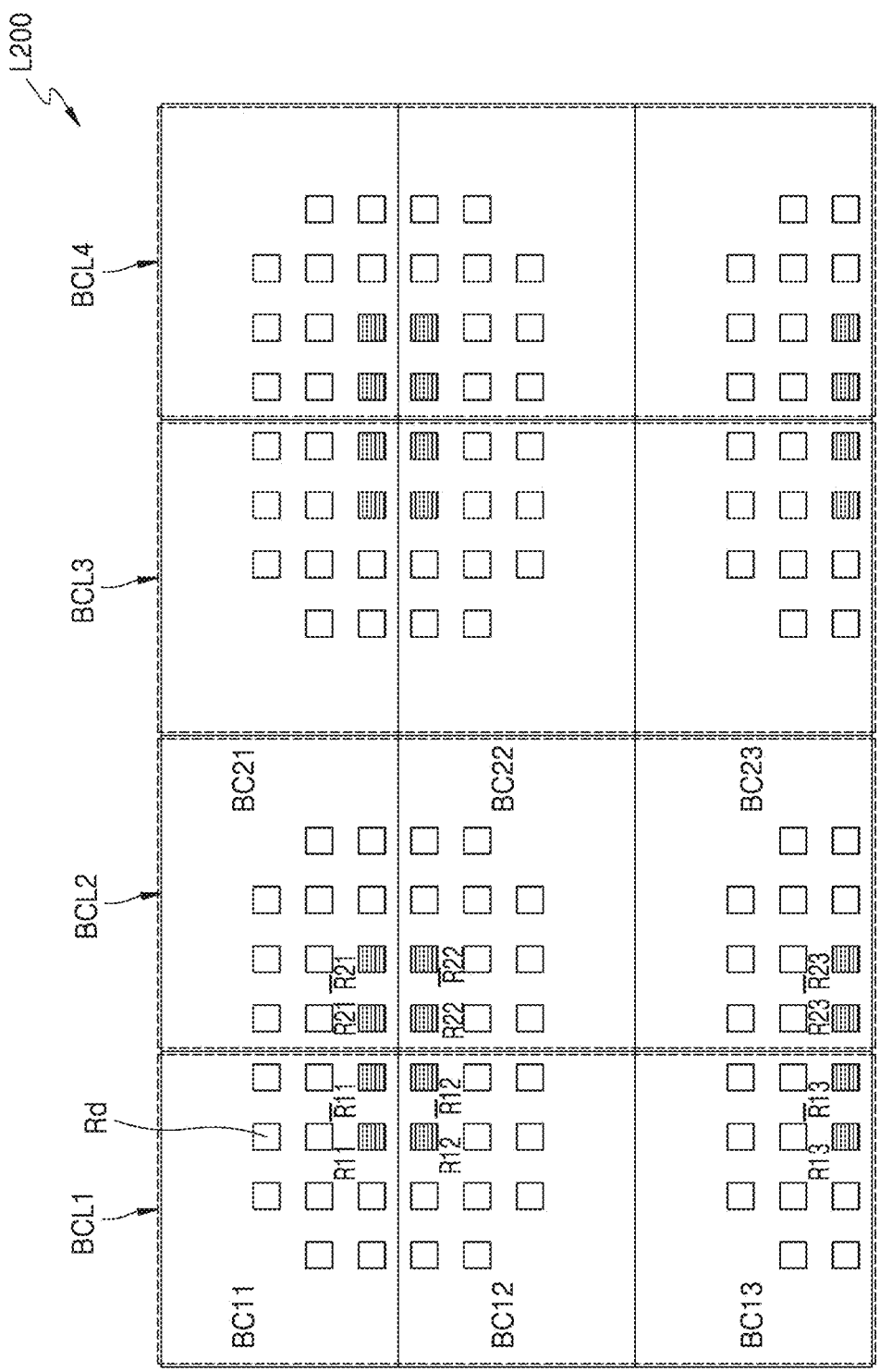

PROCESSING DEVICE BASED ON MAGNETIC TUNNEL JUNCTION (MTJ) ELEMENT AND ELECTRONIC SYSTEM INCLUDING THE PROCESSING DEVICE

CROSS-REFERENCE TO RELATED APPLICATION

This application is based on and claims priority under 35 U.S.C. § 119 to Korean Patent Application No. 10-2021-0019998, filed on Feb. 15, 2021 in the Korean Intellectual Property Office, the disclosure of which is incorporated by reference herein in its entirety.

BACKGROUND

The inventive concepts relate to a processing device, and more particularly, to a processing device performing an analog calculation, and an electronic system including the processing device.

To overcome the structural limits of chips based on the von Neumann structure, neural network hardware and/or neuromorphic computing hardware have been developed based on neural networks including neurons as base units (e.g., as modeled based on neurons included in a human brain) and synapses providing interconnection between the neurons. The neural network may exceed the limits of existing machine learning algorithms and exhibits image, video, pattern learning, and recognition capability at a level close to a human capability, and has applications in various fields. In addition, the development of dedicated application-specific integrated circuit (ASIC) chips for performing of calculation operations faster with low power consumption has been underway.

SUMMARY

The inventive concepts provide a processing device having improved reliability and power consumption efficiency of analog calculations as well as high cost efficiency due to reduction in a size of a bit-cell, and an electronic system including the processing device.

According to an aspect of the inventive concepts, there is provided a processing device based on a magnetic tunnel junction (MTJ) element including: at least one bit-cell line on which a plurality of bit-cells are connected to each other in series, wherein each of the bit-cells includes a first MTJ element configured to be switched between different resistance states and to be programmed with a resistance value; a first MTJ element configured to be switched between different resistance states and to be programmed with a resistance value; a first switching element connected to the first MTJ element in series and configured to switch an application of at least one of a current or a voltage to the first MTJ element; and a second switching element connected to the second MTJ element in series and configured to switch an application of at least one of a current or a voltage to the second MTJ element, wherein the second switching element is configured to perform a switching complementary to the first switching element, and wherein on the bit-cell line, two adjacent bit-cells are connected to each other in series in a mirroring structure.

In addition, according to another aspect of the inventive concepts, there is provided a processing device based on a magnetic tunnel junction (MTJ) element including: a substrate; an active layer on the substrate, the active layer including a plurality of switching elements; at least two metal distribution layers on the active layer, the at least two metal distribution layers including a first upper metal layer and a second upper metal layer; an MTJ element layer arranged between the first upper metal layer and the second upper metal layer; and at least one bit-cell line on which a plurality of bit-cells are connected to each other in series, wherein each of the bit-cells includes a first MTJ element on the MTJ element layer, a second MTJ element on the MTJ element layer and connected to the first MTJ element in parallel, a first switching element in the active layer and connected to the first MTJ element in series, and a second switching element in the active layer and connected to the second MTJ element in series, the first MTJ element and the second MTJ element are programmed with complementary resistance values to each other, the first switching element and the second switching element are configured to switch complementarily to each other and to, respectively, apply at least one of a current or a voltage to the first MTJ element and the second MTJ element, and on the at least one bit-cell line, two adjacent bit-cells are connected to each other in series in a mirroring structure, and the mirroring structure includes a first mirroring of the first switching element and the second switching element and a second mirroring of the first MTJ element and the second MTJ element, and the first mirroring and the second mirroring are alternately repeated between the two adjacent bit-cells in one direction of the at least one bit-cell line.

Furthermore, according to an aspect of the inventive concepts, there is provided an electronic system including: a processing device based on a magnetic tunnel junction (MTJ) element; a processing unit configured to control an operation of the processing device; and a memory unit configured to store at least one of programs, data, and commands to be used in the operation of the processing device; wherein the processing device includes at least one bit-cell line on which a plurality of bit-cells are connected to each other in series, wherein each of the bit-cells includes a first MTJ element configured to be switched between different resistance states and to be programmed with a resistance value; a first MTJ element configured to be switched between different resistance states and to be programmed with a resistance value; a first switching element connected to the first MTJ element in series and configured to switch an application of at least one of a current or a voltage to the first MTJ element; and a second switching element connected to the second MTJ element in series and configured to switch an application of at least one of a current or a voltage to the second MTJ element, wherein the second switching element is configured to perform a switching complementary to the first switching element, and wherein on the bit-cell line, two adjacent bit-cells are connected to each other in series in a mirroring structure.

According to another aspect of the inventive concepts, there is provided an electronic system including: a processing device based on a magnetic tunnel junction (MTJ) element; a processing unit configured to control an operation of the processing device; a memory unit configured to store at least one of programs, data, and commands to be used in the operation of the processing device; a sensor module configured to collect information; and a communication module configured to communicate with an external device, wherein the processing device includes: a substrate, an active layer on the substrate, the active layer including a plurality of switching elements, at least two metal distribution layers on the active layer, the at least two metal distribution layers including a first upper metal layer and a second upper metal layer, an MTJ element layer between the first upper metal layer and the second upper metal layer; and at least one bit-cell line on which a plurality of bit-cells are connected to each other in series, wherein each of the bit-cells includes a first MTJ element on the MTJ element layer, a second MTJ element on the MTJ element layer and connected to the first MTJ element in parallel, a first switching element in the active layer and connected to the first MTJ element in series, and a second switching element in the active layer and connected to the second MTJ element in series, the first MTJ element and the second MTJ element are programmed with complementary resistance values to each other, the first switching element and the second switching element are configured to switch complementarily to each other and to, respectively, apply at least one of a current or a voltage to the first MTJ element and the second MTJ element, and on the at least one bit-cell line, two adjacent bit-cells are connected to each other in series in a mirroring structure, the mirroring structure including a first mirroring of the first switching element and the second switching element, and a second mirroring of the first MTJ element and the second MTJ element, and the first mirroring and the second mirroring are alternately repeated between two adjacent bit-cells in one direction of the at least one bit-cell line.

BRIEF DESCRIPTION OF THE DRAWINGS

Example embodiments of the inventive concepts will be more clearly understood from the following detailed description taken in conjunction with the accompanying drawings in which:

FIG. 11 is a horizontal cross-sectional view illustrating in detail an MTJ element layer in the portion of the processing device of FIG. 10;

DETAILED DESCRIPTION OF THE EMBODIMENTS

Figure 1:
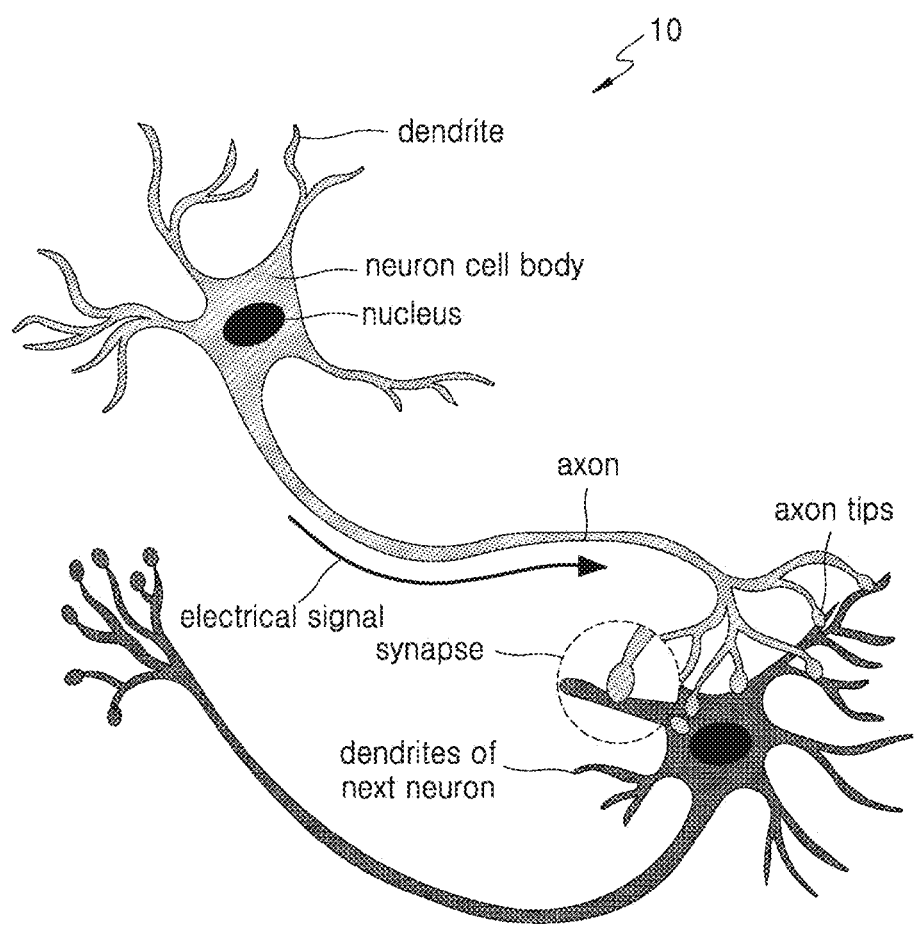
FIG. 1 is a conceptual diagram of a biological neuron and an operation thereof.

Hereinafter, some example embodiments of the inventive concepts will be described in detail with reference to the accompanying drawings. Identical reference numerals are used for the same constituent elements in the drawings, and duplicate descriptions thereof are omitted.

When the terms "about" and/or "substantially" are used in this specification in connection with a numerical value, it is intended that the associated numerical value includes a manufacturing tolerance (e.g., ±10%) around the stated numerical value. Moreover, when the words "generally" and/or "substantially" are used in connection with a structure and/or configuration, it is intended that precision of the structure and/or configuration is not required, but that latitude for the structure and/or configuration is within the scope of the disclosure. Further, it will be understood that these values, structures, and/or configurations should be construed as including a manufacturing or operational tolerance (e.g., ±10%) around the stated numerical values, structures, or configurations.

Figure 2:
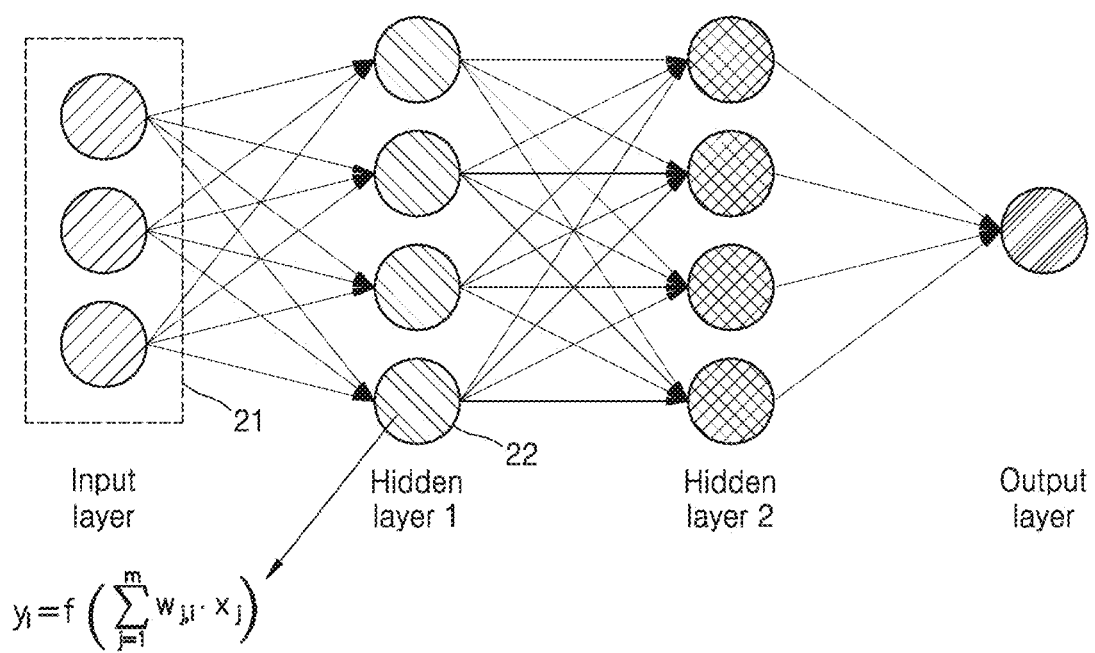
FIG. 2 is a conceptual diagram of an example of a neural network.

FIG. 1 is a conceptual diagram of a biological neuron and an operation thereof, and FIG. 2 is a conceptual diagram of an example of a neural network.

Referring to FIG. 1, a biological neuron 10 may denote a cell in a human nervous system, and may be one of basic biological calculation subjects. A human brain may include about 100 billion biological neurons 10 and about 100 trillion interconnections located therebetween.

The biological neuron 10 may include a single cell, and may include a neuron cell body including various organelles, a plurality of dendrites radiating from a cell body, an axon expanding from the cell body to another neuron, etc. The various organelles may include, for example, a nucleus, mitochondria, endoplasmic reticulum, etc.

In general, the axon may transmit signals from a neuron to another neuron, and the dendrite may receive signals from the other neuron. For example, when different neurons are connected to each other, a signal transmitted via the axon of the neuron may be received by a dendrite of the other neuron. The signal may be transmitted via a specialized interconnection called a synapse, and several neurons may be interconnected to each other to constitute a neural network. The neuron secreting a neurotransmitter (e.g., the neuron transmitting a signal) may be referred to as a pre-synaptic neuron with the synapse as a reference, and the neuron receiving information transmitted via the neurotransmitter (e.g., the neuron receiving a signal) may be referred to as a post-synaptic neuron.

The brain (e.g., a human brain) may learn and memorize a large amount of information by transmitting and processing various signals via the neural network formed by a large number of neurons interconnected to each other. Various attempts to develop a processing device and/or a computing device for efficiently processing a large amount of information by imitating the biological neural network have been maintained and developed.

Referring to FIG. 2, a neural network 20 may include an artificial neural network (ANN) imitating the above-described biological neural network, and may include, for example, a deep neural network (DNN). In FIG. 2, for convenience of description, the neural network 20 is illustrated to include two of hidden layers. However, the neural network 20 is not limited thereto, and may include various number of hidden layers (e.g., one or more). In addition, in FIG. 2, the neural network 20 is illustrated to include an input layer 21, which is separate therefrom for receiving input data, but according to some embodiments, the input data may be input directly to a hidden layer.

Nodes included in the layers, except for output layers in the neural network 20, may be connected to nodes of a next layer (e.g., a down-stream layer) via links for transmitting an output signal. Values obtained by multiplying node values of the nodes included in a previous layer by a weight allocated to each link may be input to one node via the links. Node values of the previous layer may correspond to axon values, and the weight may correspond to a synaptic weight. The weight may be referred to as a parameter of the neural network 20. An activation function may include a Sigmoid function, a hyperbolic tangent (tanh), a rectified linear unit (ReLU) function, and/or the like, and a non-linearity of the neural network 20 may be implemented by the activation function.

An output of an arbitrary node 22 included in the neural network 20 may be represented by Formula 1 below.

$$y_i = f\left(\sum_{j=1}^{m} w_{j,i} x_j\right)$$ Formula 1

Formula 1 may represent an output value $y_i$ of an $i^{th}$ node 22 for m input values in a layer. $x_j$ may represent an output value of a $j^{th}$ node of the previous layer, and $w_{j,i}$ may represent a weight applied to an interconnection portion between the $j^{th}$ node of the previous layer and the $i^{th}$ node 22 of a present layer. f may represent an activation function. As illustrated in Formula 1, in an activation function, an accumulation result of multiplying the input value $x_j$ by the weight $w_{j,i}$ may be used. For example, an operation of multiplying the input value $x_j$ by the weight $w_{j,i}$ and adding results thereof (e.g., a multiply accumulate operation (MAC)) may be performed. In addition to this application, there may be various applications requiring the MAC operation, and to this end, a processing device capable of processing the MAC operation in an analog circuit region may be used.

Figure 3:
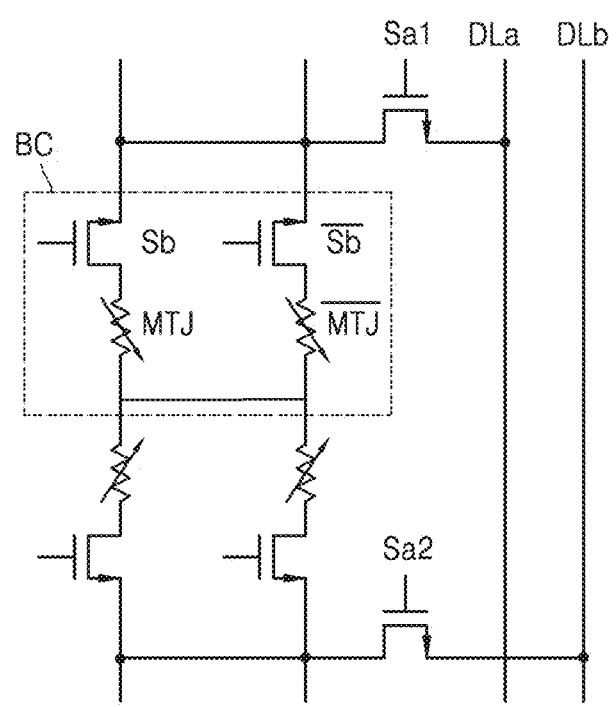
FIG. 3 is a circuit diagram of a bit-cell included in a processing device based on a magnetic tunnel junction (MTJ) element, according to some example embodiments.

FIG. 3 is a circuit diagram of a bit-cell included in a processing device 100 based on the MTJ element according to some example embodiments.

Referring to FIG. 3, the processing device 100 based on the MTJ element (hereinafter, to be simply referred to as 'a processing device') may include a device to implement a neuromorphic processor, a neural processor, and/or the like, and may include a plurality of bit-cells (BCs) arranged in a two-dimensional array structure. The processing device 100 according to some embodiments may include an in-memory processing device which, for example, stores data in a memory, that is, in first and second MTJ elements MTJ and $\overline{MTJ}$, and uses data stored therein when an operation is needed.

In FIG. 3, a circuit portion corresponding to a unit bit-cell BC is represented by a dashed line. The unit bit-cell BC may include a pair of MTJ elements MTJ and $\overline{MTJ}$, and the pair of bit-cell switching elements Sb and $\overline{Sb}$ respectively connected to the first MTJ element MTJ and the second MTJ element $\overline{MTJ}$. In some embodiments, the pair of bit-cell switching elements Sb and $\overline{Sb}$ may be connected to a data line DLa or DLb via a first or second access switching element Sa1 or Sa2. However, the circuit of the bit-cell BC illustrated in FIG. 3 is only an example, and the bit-cell BC may be implemented in a different manner from the circuit in FIG. 3, e.g., by using other circuit elements. In this case, bars (-) of $\overline{MTJ}$ and $\overline{Sb}$ may indicate complementary operations to MTJ and Sb, respectively.

By using the complementary operation, the pair of MTJ elements MTJ and $\overline{MTJ}$ may be programmed with different resistance values from each other. In addition, the resistance values of the pair of MTJ elements MTJ and $\overline{MTJ}$ may be determined by a weight applied to the bit-cell BC. For example, each of the first and second MTJ elements MTJ and $\overline{MTJ}$ may have a resistance value of any one resistance value of two resistance values, that is, $R_{AP}$ or $R_P$. For example, the resistance value of $R_{AP}$ may be, for example, about 20Ω, and the resistance value of $R_P$ may be, for example, about 5Ω. However, the resistance values of $R_{AP}$ and/or $R_P$ are not limited thereto. Further detailed descriptions of the resistance values of $R_{AP}$ and $R_P$, will be given with reference to FIGS. 4A and 4B.

In some embodiments, when the weight applicable to the bit-cell BC is assumed as '−1' and/or '1', and the weight of '1' is applied to the bit-cell BC, a first MTJ element MTJ may be programmed to $R_{AP}$ (e.g., about 20Ω), and a second MTJ element $\overline{MTJ}$ may be programmed to $R_P$ (e.g., about 5Ω). Alternatively, when the bit-cell BC is applied with the weight of '−1', the first MTJ element MTJ may be programmed to $R_{AP}$ (for example, about 5Ω), and the second MTJ element $\overline{MTJ}$ may be programmed to $R_P$ (for example, about 20Ω). In this example, the resistance values of the first and second MTJ elements MTJ and $\overline{MTJ}$ may be programmed complementarily so that the first and second MTJ elements MTJ and $\overline{MTJ}$ have different resistance values from each other.

For reference, an MTJ element may include an element switchable between different resistance states from each other according to a voltage or a current applied to both ends thereof, and may have a plurality of resistance states. In addition, an operation in which the MTJ element is changed from a high resistance state to a low resistance state may be referred to as a set operation, and an operation in which the MTJ element is changed from a low resistance state to a high resistance state may be referred to as a reset operation. Thus, the MTJ element may be programmed to a high resistance state or a low resistance state by using a set operation and a reset operation. Detailed descriptions on a structure and an operation of the MTJ element will be given with reference to FIGS. 4A and 4B.

Each of the first and second MTJ elements MTJ and $\overline{MTJ}$ may be programmed in a method below. First, both ends of the first and second MTJ elements MTJ and $\overline{MTJ}$ to be programmed may be connected to a first data line DLa and a second data line DLb, respectively. Taking the first MTJ element MTJ as an example, one end of the first MTJ element MTJ may be connected to the first data line DLa via the first access switching element Sa1 and a first bit-cell switching element Sb, and the other end of the first MTJ element MTJ may be connected to the second data line DLb via the second access switching element Sa2.

As illustrated in FIG. 3, because a bit-cell switching element and an MTJ element of the other bit-cell are arranged between the first MTJ element MTJ and the second access switching element Sa2, it may be impossible to program only the first MTJ element MTJ. Therefore, in the processing device 100 according to some example embodiments, an MTJ element of each bit-cell BC may not be individually programmed, but MTJ elements of two adjacent bit-cells BC may be simultaneously programmed. However, to describe the case where only the first MTJ element MTJ is programmed, it is assumed that there are no bit-cell switching elements and MTJ elements of other bit-cells for the time being.

When the first MTJ element MTJ is connected to the first and second data lines DLa and DLb via the first bit-cell switching element Sb and the first access switching element Sa1, and the second access switching element Sa2, respectively, by controlling voltages at both ends of the first MTJ element MTJ, or by controlling the current flowing through the first MTJ element MTJ, the program operation for the first MTJ element MTJ, that is, the write operation, may be performed. In this case, the program operation may correspond to the set or reset operation according to a previous state of the first MTJ element MTJ. Unlike this case, when the second MTJ element $\overline{\text{MTJ}}$ is connected to the first and second data lines DLa and DLb via the second bit-cell switching element $\overline{\text{Sb}}$ and the first access switching element Sa1, and the second access switching element Sa2, respectively, the program operation for the second MTJ element $\overline{\text{MTJ}}$ may be performed.

On the other hand, voltages and/or currents applied to program the first and second MTJ elements MTJ and $\overline{\text{MTJ}}$ may be relatively greater than voltages and/or currents applied to read the resistance values of the first and second MTJ elements MTJ and $\overline{\text{MTJ}}$. For example, the first and second MTJ elements MTJ and $\overline{\text{MTJ}}$ may not be programmed by the voltages and/or the current applied to read the resistance values of the first and second MTJ elements MTJ and $\overline{\text{MTJ}}$.

A pair of bit-cell switching elements Sb and $\overline{\text{Sb}}$ connected in series to the first and second MTJ elements MTJ and $\overline{\text{MTJ}}$ may perform an on/off operation according to an input applied to the bit-cell BC. In addition, the pair of bit-cell switching elements Sb and $\overline{\text{Sb}}$ may operate complementarily so that, when one is off, then the other is on. For example, the unit bit-cell BC may be designed so that, when the input applicable to the bit-cell BC is assumed as '−1' or '1', and when the input '1' is applied, the first bit-cell switching element Sb may be off and the second bit-cell switching element $\overline{\text{Sb}}$ may be on, and when the input '−1' is applied, the first bit-cell switching element Sb may be on and the second bit-cell switching element $\overline{\text{Sb}}$ may be off.

According to an operation method of the MTJ element and the bit-cell switching element described above, the resistance value of the bit-cell BC may vary according to the weight and the input applied to the bit-cell BC in FIG. 3. The relationship between the weight, input, and resistance values of the bit-cell BC may be summarized as Table 1 below.

TABLE 1

| Input | Weight | Input*Weight | Resistance Value (Ω) |
|---|---|---|---|
| 1 | 1 | 1 | 20(Rap) |
| 1 | −1 | −1 | 5(Rp) |
| −1 | 1 | −1 | 5(Rp) |
| −1 | −1 | 1 | 20(Rap) |

Referring to Table 1, when a value of multiplying the input by the weight is 1, the resistance value of the bit-cell BC may be about 20Ω, and when a value of multiplying the input by the weight is −1, the resistance value of the bit-cell BC may be about 5Ω.

For example, when the resistance value of the bit-cell BC is measured and/or a voltage drop at the bit-cell BC (e.g., due to the current) of a constant value is measured, a multiplication of the input to the weight applied to the bit-cell BC may be known. By using this characteristic of the bit-cell BC, a processing device (for example, a neuromorphic process, and/or the like) for obtaining multiplications of the input and the weight and a sum of the multiplications may be implemented. For reference, Input*Weight may correspond to an XNOR operation value.

Figure 4A:
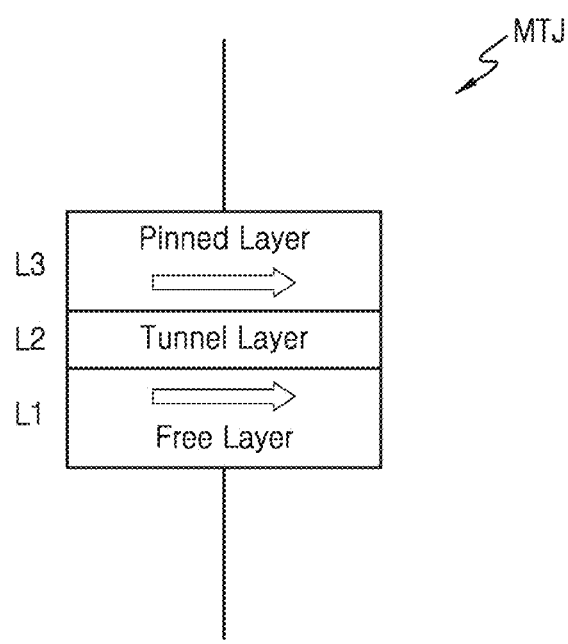
FIGS. 4A and 4B are conceptual diagrams of a structure and an operation of an MTJ element in FIG. 3 to which the bit-cell is applied.
Figure 4B:
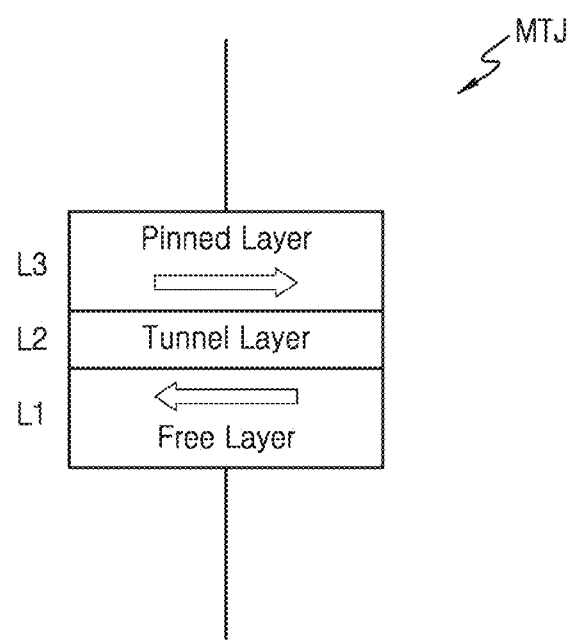

FIGS. 4A and 4B are conceptual diagrams of a structure and an operation of an MTJ element applied to the bit-cell BC in FIG. 3. The MTJ element applied to the bit-cell BC, as applied in FIG. 3, may have the resistance value thereof that varies according to a magnitude and/or a direction of the current (and/or voltage), and may have a non-volatile characteristic such that even when the input current (and/or voltage) is cut off, the resistance value thereof is maintained as is.

Referring to FIGS. 4A and 4B, the MTJ element MTJ may include a pinned layer L3, a free layer L1, and a tunnel layer L2. A magnetization direction of the pinned layer L3 may be fixed, and the magnetization direction of the free layer L1 may be the same as or different from that of the pinned layer L3. For example, the magnetization direction of the free layer L1 may be adjustable (e.g., programmable).

In FIG. 4A, the MTJ element MTJ illustrates a state in which the magnetization directions of the free layer L1 and the pinned layer L3 are in parallel with each other. When the magnetization directions are in parallel with each other in this manner, the resistance value $R_P$ of the MTJ element MTJ may be decreased, for example, to about 5Ω. In addition, in FIG. 4B, the MTJ element MTJ may show a state in which the magnetization directions of the free layer L1 and the pinned layer L3 are in anti-parallel with each other. When the magnetization directions are in anti-parallel with each other in this manner, the resistance value $R_{AP}$ of the MTJ element MTJ may be increased, for example, to about 20Ω. Accordingly, changing the magnetization direction of the free layer L1 may change the resistance value of the MTJ element MTJ, and thereby the MTJ element MTJ may be programmed.

The magnetization direction of the free layer L1 may be changed by electrical/magnetic causes provided from the outside and/or the inside of a resistive memory cell. The free layer L1 may include a material having a changeable magnetization direction, for example, a ferromagnetic material. The free layer L1 may include, for example, at least one of CoFeB, FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, $Y_3Fe_5O_{12}$, and/or a combination thereof.

The tunnel layer L2 may have a thickness less than a spin diffusion distance, and/or may include a non-magnetic material such as at least one Mg, Ti, Al, MgZn, a MgB oxide, and V, and/or a combination thereof.

The pinned layer L3 may have a pinned magnetization direction due to an anti-ferromagnetic layer. The pinned layer L3 may include a ferromagnetic material such as CoFeB, FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, $Y_3Fe_5O_{12}$, and/or a combination thereof, and may further include an anti-ferromagnetic layer and/or a synthesized anti-ferromagnetic layer for pinning the magnetization direction. The anti-ferromagnetic layer may include an anti-ferromagnetic material such as PtMn, IrMn, MnO, MnS, MnTe, $MnF_2$, $FeC_{l2}$, FeO, $CoC_{l2}$, CoO, $NiC_{l2}$, NiO, Cr, and/or a combination thereof. In some embodiments, the synthesized anti-ferromagnetic layer may include Cu, Ru, Ir, and/or a combination thereof.

Figure 5:
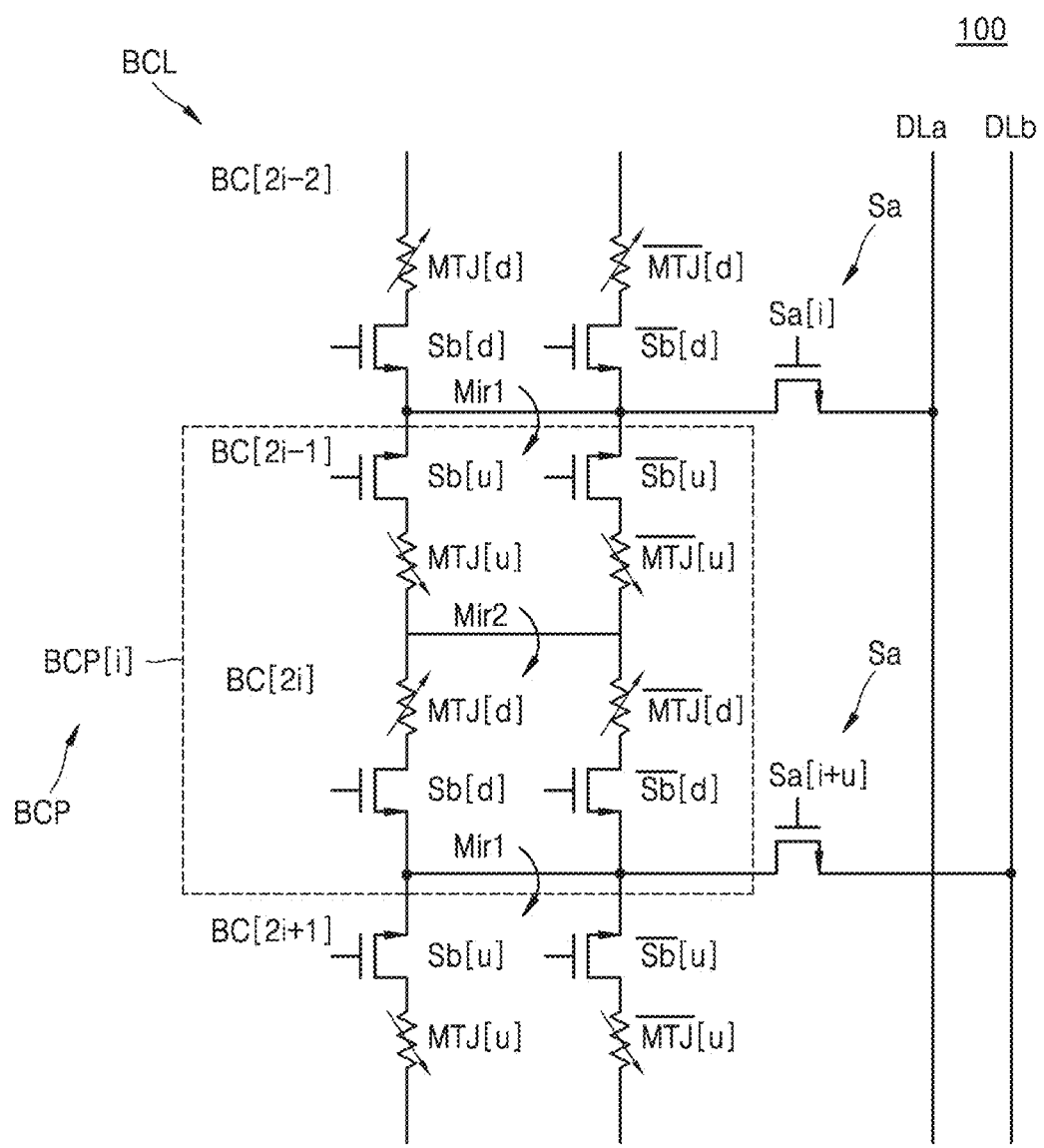
FIG. 5 is a circuit diagram of a bit-cell pair included in the processing device, according to some example embodiments.

FIG. 5 is a circuit diagram of a bit-cell pair included in the processing device 100, according to some example embodiments.

Referring to FIG. 5, in the processing device 100, the bit-cells BC may be connected to each other in series in one direction and constitute a bit-cell line BCL. In FIG. 5, the bit-cell line BCL is illustrated to include four bit-cells connected to each other in series. However, in the processing device 100, the number of bit-cells BC included in the bit-cell line BCL is not limited to four, and may include a fewer and/or greater number of bit-cells BC.

In the processing device 100, two of the adjacent bit-cells BC connected to each other in series on the bit-cell line BCL may constitute a bit-cell pair BCP. For example, an $i^{th}$ (where i is a natural number) bit-cell pair BCP[i] may include a $(2i-1)^{th}$ bit-cell BC[2i-1] and a $(2i)^{th}$ bit-cell BC[2i] connected in series to the $(2i-1)^{th}$ bit-cell BC[2i-1].

In the bit-cell pair BCP, two adjacent the bit-cells BC may be connected to each other in series in a second mirroring structure Mir2. For example, as illustrated in FIG. 5, MTJ elements MTJ[u] and $\overline{MTJ}$[u] of the $(2i-1)^{th}$ bit-cell BC[2i-1] (e.g., the upper illustrated MTJ elements MTJ[u] and $\overline{MTJ}$[u]) may be connected in series to MTJ elements MTJ[d] and $\overline{MTJ}$[d] of the $(2i)^{th}$ bit-cell BC[2i] (e.g., the lower illustrated MTJ elements MTJ[d] and $\overline{MTJ}$[d]) in symmetry therewith in the second mirroring structure Mir2. In addition, two bit-cells BC adjacent to each other in two adjacent bit-cell pairs BCP may be connected to each other in series in a first mirroring structure Mir1. As illustrated in FIG. 5, the bit-cell switching elements Sb[u] and $\overline{Sb}$[u] of the $(2i-1)^{th}$ bit-cell BC[2i-1] may be connected in series to bit-cell switching elements Sb[d] and Sb$\overline{Sb}$[d] of a $[2i-2]^{th}$ bit-cell BC[2i-2], with symmetry in the first mirroring structure Mir1. In this case, the $(2i-2)^{th}$ bit-cell BC[2i-2] may correspond to an $(i-1)^{th}$ bit-cell pair BCP. However, the example embodiments are not so limited, and the first mirroring structure Mir1 and the second mirroring structure Mir2 may be alternately arranged along the bit-cell line BCL.

In some example embodiments, in relation with the second mirroring structure Mir2 of the bit-cell pair BCP, the upper MTJ elements MTJ[u] and $\overline{MTJ}$[u] and the lower MTJ elements MTJ[d] and $\overline{MTJ}$[d] may be programmed complementarily to each other. The complementary programming of the bit-cell pair BCP will be described in more detail with respect to FIGS. 6A through 6C.

In the processing device 100, one of the access switching element Sa may be arranged per bit-cell pair BCP. However, because when one bit-cell pair BCP is programmed two of the access switching elements Sa may be required, the number of access switching elements Sa may be greater than the number of the bit-cell pairs BCP (e.g., by one). For example, when the bit-cell line BCL includes 2n (where n is a natural number), corresponding to an even number of the bit-cells BC, the number of bit-cell pairs BCP may be n, and the number of the access switching elements Sa may be (n+1). On the other hand, when the bit-cell line BCL includes (2n−1) (n is a natural number), corresponding to an odd number of the bit-cells BC, the number of bit-cell pairs BCP may be (n−1), and the number of the access switching elements Sa may be n+1. In some embodiments, when the bit-cell line BCL includes an odd number of the bit-cells BC, a first and/or last bit-cell BC may not constitute the bit-cell pair BCP, and in addition, the first or last bit-cell BC may be arranged between the two adjacent access switching elements Sa.

The processing device 100 may reduce a size of the bit-cell BC, and/or a size of a bit-cell array including the bit-cells BC, by including the second mirroring structure Mir2 of the MTJ elements in the bit-cell pair BCP and the first mirroring structure Mir1 of the bit-cell switching elements between adjacent bit-cell pairs BCP. For example, because the access switching element Sa is used only when programming the MTJ elements MTJ for storing weights of the neural network in the beginning, and when performing an analog MAC calculation, only the read operation for the input vector is performed, by optimizing sizes of a biasing line and the access switching element Sa, the size of the bit-cell BC and the size of the bit-cell array may be reduced.

In addition, in the processing device 100, because a via contact is not formed in the bit-cell BC, the size of the bit-cell and the size of the bit-cell array may be further reduced. Furthermore, in the processing device 100, because the MTJ element MTJ connected in series is used as a memory and there is no via contact, the reliability of an analog operation and the power consumption efficiency may be improved. Descriptions related to the via contact will be given in more detail with respect to FIGS. 10 and 11.

Figure 6A:
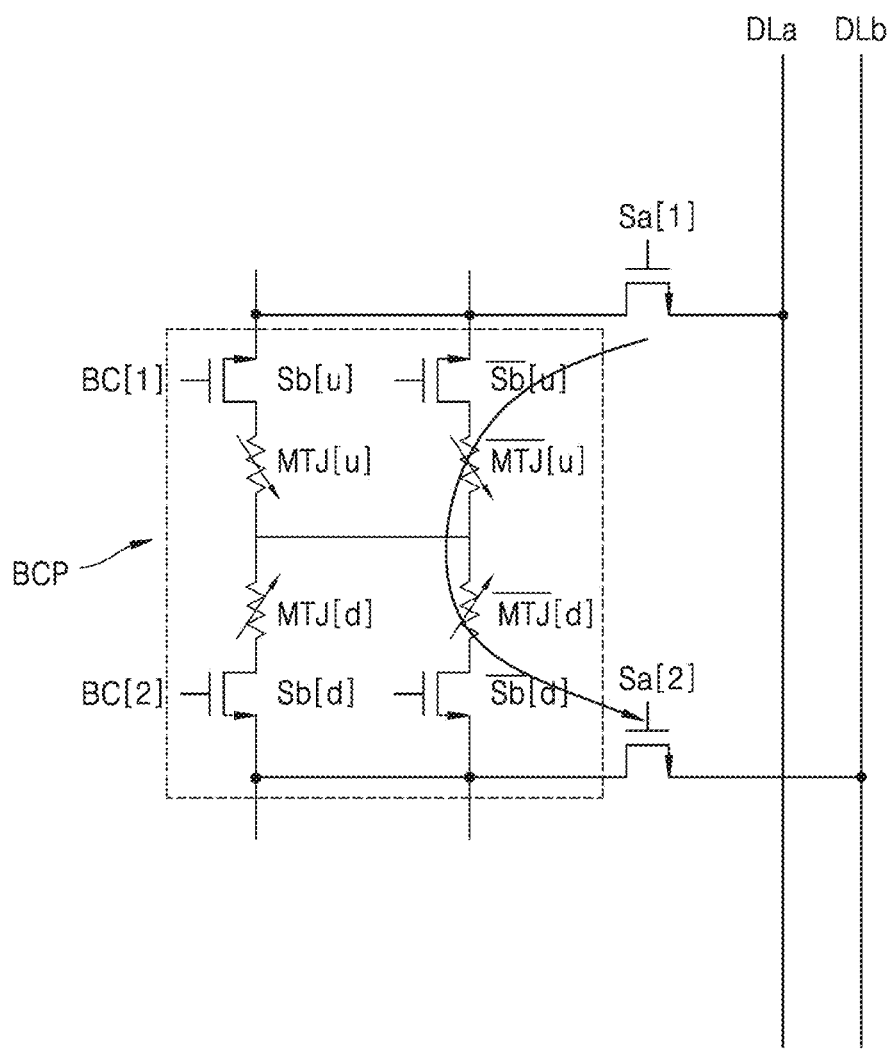
FIGS. 6A through 6C are circuit diagrams and conceptual diagrams for describing a program operation of the bit-cell pair in FIG. 5.
Figure 6B:
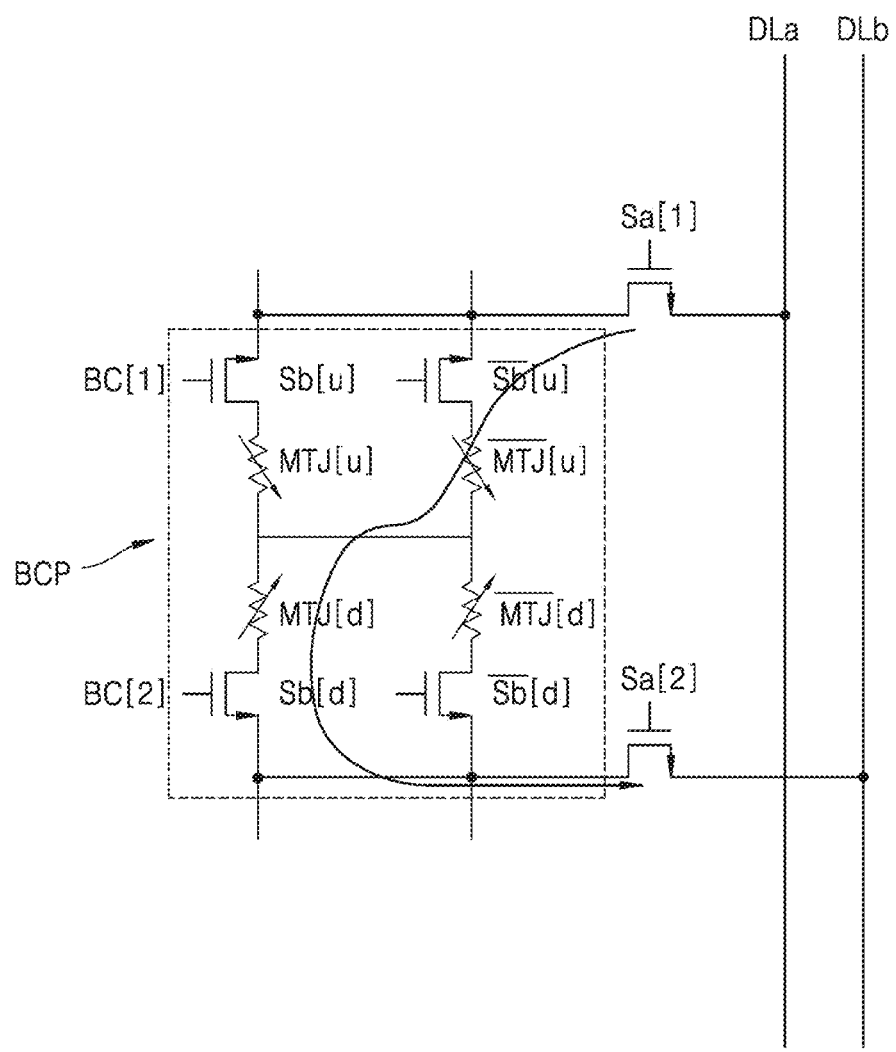
Figure 6C:
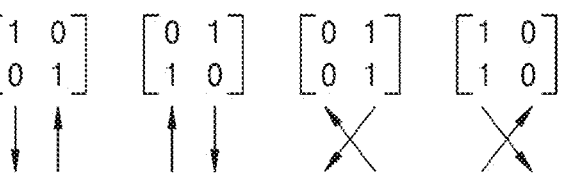

FIGS. 6A through 6C are circuit diagrams and conceptual diagrams for describing a program operation of the bit-cell pair BCP in FIG. 5.

Referring to FIG. 6A, an upper MTJ element $\overline{MTJ}$[u] and a lower MTJ element $\overline{MTJ}$[d] may be simultaneously programmed, by turning on the first and second access switching elements Sa[1] and Sa[2], turning on the upper bit-cell switching element $\overline{Sb}$[u] and the lower bit-cell switching element $\overline{Sb}$[d], turning off the upper bit-cell switching element Sb[u] and the lower bit-cell switching element Sb[d], and allowing the current to flow through the upper MTJ element $\overline{MTJ}$[u] and the lower MTJ element $\overline{MTJ}$[d], as illustrated by a large arrow in FIG. 6A. The upper MTJ element $\overline{MTJ}$[u] and the lower MTJ element $\overline{MTJ}$[d] may be programmed in opposite directions (e.g., according to a direction of a spin-polarized current) to each other. For example, the upper MTJ element $\overline{MTJ}$[u] and the lower MTJ element $\overline{MTJ}$[d] may be programmed with different resistance values from each other.

Thereafter, the upper MTJ element $\overline{MTJ}$[u] and the lower MTJ element MTJ[d] may be simultaneously programmed, by turning off the upper bit-cell switching element $\overline{Sb}$[u] and the lower bit-cell switching element $\overline{Sb}$[d], turning on the upper bit-cell switching element Sb[u] and the lower bit-cell switching element Sb[d], and allowing the current to flow through the upper MTJ element MTJ[u] and the lower MTJ element MTJ[d]. The upper MTJ element MTJ[u] and the lower MTJ element MTJ[d] may also be programmed in opposite directions (e.g., according to the direction of the spin-polarized current) to each other.

Referring to FIG. 6B, the upper MTJ element $\overline{MTJ}$[u] and the lower MTJ element MTJ[d] may be simultaneously programmed, by turning on the first and second access switching elements Sa[1] and Sa[2], turning on the upper bit-cell switching element $\overline{Sb}$[u] and the lower bit-cell switching element Sb[d], turning off the upper bit-cell switching element Sb[u] and the lower bit-cell switching element $\overline{Sb}$[d], and allowing the current to flow through the upper MTJ element $\overline{\text{MTJ}}$[u] and the lower MTJ element MTJ[d] as illustrated by the large arrow in FIG. 6B. In this case, the upper MTJ element $\overline{\text{MTJ}}$[u] and the lower MTJ element MTJ[d] may be programmed in opposite directions according to the direction of the spin-polarized current.

Thereafter, the upper MTJ element MTJ[u] and the lower MTJ element $\overline{\text{MTJ}}$[d] may be simultaneously programmed, by turning off the upper bit-cell switching element Sb[u] and the lower bit-cell switching element Sb[d], turning on the upper bit-cell switching element $\overline{\text{Sb}}$[u] and the lower bit-cell switching element $\overline{\text{Sb}}$[d], and allowing the current to flow through the upper MTJ element MTJ[u] and the lower MTJ element $\overline{\text{MTJ}}$[d]. The upper MTJ element MTJ[u] and the lower MTJ element $\overline{\text{MTJ}}$[d] may also be programmed in opposite directions according to the direction of the spin-polarized current to each other.

A programming method of allowing the current to flow through two MTJ elements immediately adjacent to each other in a downward direction as illustrated in FIG. 6A may be referred to as a vertical write, and a programming method of allowing the current to flow through two MTJ elements adjacent to each other in a diagonal direction as illustrated in FIG. 6B may be referred to as a diagonal write.

Referring to FIG. 6C, the number of cases of patterns programmable to one bit-cell pair BCP by using the vertical write in FIG. 6A and/or the diagonal write in FIG. 6B may be four. In this case, any other pattern except for these cases may not be programmed, and may not be necessary for an XNOR operation. For example, when resistance values of the upper first MTJ element MTJ[u] and upper second MTJ element $\overline{\text{MTJ}}$[u] of the first bit-cell BC[1] are referred to as R11 and R12, respectively, resistance values of the lower first MTJ element MTJ[d] and the lower second MTJ element $\overline{\text{MTJ}}$[d] of a second bit-cell BC[2] are referred to as R21 and R22, respectively, and each of R11, R12, R21, and R22 has a resistance value corresponding to 1 or 0, a matrix R including R11, R12, R21, and R22 as elements may, as illustrated in FIG. 6C, have any one pattern of $$\begin{bmatrix} 1 & 0 \\ 0 & 1 \end{bmatrix}, \begin{bmatrix} 0 & 1 \\ 1 & 0 \end{bmatrix}, \begin{bmatrix} 0 & 1 \\ 0 & 1 \end{bmatrix}, \text{ and } \begin{bmatrix} 1 & 0 \\ 1 & 0 \end{bmatrix}.$$

In addition, as to be understood from arrows thereunder, the two left patterns may be programmed by using the vertical write, and the two right patterns may be programmed by using the diagonal write. For reference, in this case and description, '1' may correspond to $R_{AP}$, for example, about 25Ω, and '0' may correspond to $R_P$, for example, about 5Ω However, to the contrary, '1' may correspond to $R_P$, and '0' may correspond to $R_{AP}$.

In the processing device 100, based on the mirroring structure and a method of writing two MTJ elements simultaneously, the access switching elements arranged by one per bit-cell (wherein the number of access switching elements is greater than the number of bit-cells by one) may be replaced by the access switching elements arranged by one per bit-cell pair (wherein the number of access switching elements is greater than the number of bit-cell pairs by one). For example, the number of access switching elements may be reduced to one per two bit-cells. Accordingly, a size of a bit-cell may be reduced, and in addition, because a via contact is not required based on a mirroring structure, the size of the bit-cell may be further reduced, and, therefore, the size of the bit-cell array may be further reduced. In relation with reduction of the access switching element, detailed descriptions thereof will be given with reference to FIGS. 12A and 12B.

Figure 7:
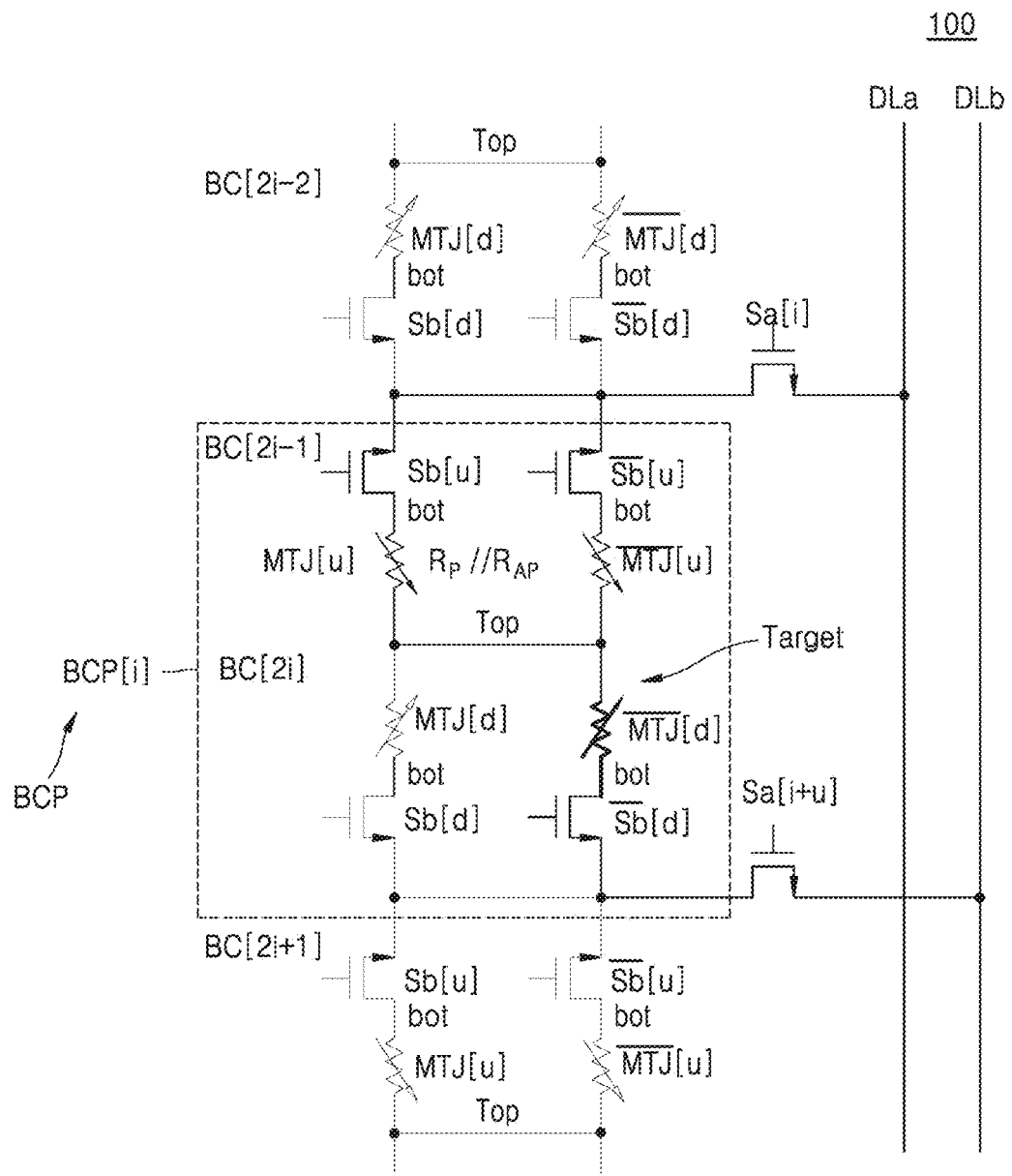
FIG. 7 is a circuit diagram for describing a read operation in the bit-cell pair in FIG. 5.

FIG. 7 is a circuit diagram for describing the read operation in the bit-cell pair in FIG. 5.

Referring to FIG. 7, in general, when two access switching elements are arranged in a (e.g., one) bit-cell BC, a direct access to an individual MTJ element may be possible via two access switching elements and the bit-cell switching element, and accordingly, the resistance value of a corresponding MTJ element may be directly read. Additionally, in the processing device 100, two bit-cells BC may be connected to each other in series in one bit-cell pair BCP, and in addition, the write and read operations may be simultaneously performed via two access switching elements for one bit-cell pair BCP. For example, in the case of the write operation, descriptions thereof given with reference to FIGS. 6A and 6B may be applicable.

In the case of the read operation, in addition to the bit-cell BC in which an MTJ element to be read is included, an MTJ element of another bit-cell BC on a current route may be read. For example, in FIG. 7, a case may be considered in which, when the MTJ element $\overline{\text{MTJ}}$[d] in a bold face is referred to as a target MTJ element Target to be read, all of the MTJ elements in the $(2i-1)^{th}$ bit-cell BC[2i−1] on a route are connected to the MTJ element $\overline{\text{MTJ}}$[d]. For example, the upper bit-cell switching elements Sb[u] and $\overline{\text{Sb}}$[u] are all turned on. On the other hand, as described above in a portion of the write operation with reference to FIGS. 6A and 6B, two MTJ elements MTJ[u] and $\overline{\text{MTJ}}$[u] of the $(2i-1)^{th}$ bit-cell BC[2i−1] may have different resistance values from each other. Accordingly, two MTJ elements MTJ[u] and $\overline{\text{MTJ}}$[u] of the $(2i-1)^{th}$ bit-cell BC[2i−1] on the route may be connected in parallel with each other, and regardless of each resistance value, a resistance value in a parallel form of $R_P$ and $R_{AP}$. In this case, a resistance value of $R_P//R_{AP}$, may be always read. For example, a resistance value in a parallel form of '0' and '1' may be read. In addition, two MTJ elements MTJ[u] and $\overline{\text{MTJ}}$[u] of the $(2i-1)^{th}$ bit-cell may be connected in series to the MTJ element $\overline{\text{MTJ}}$[d] of the $(2i)^{th}$ bit-cell BC[2i] or the target MTJ element Target, and the MTJ element $\overline{\text{MTJ}}$[d] may have any one of resistance values of $R_P$ and $R_{AP}$, and thus, the total resistance value on the route according to the resistance value of the MTJ element $\overline{\text{MTJ}}$[d] may be represented by the following:

$R\text{total}=R_P+R_P//R_{AP}, \text{ or } R\text{total}=R_{AP}+R_P//R_{AP}.$

In this case, the resistance values of $R_P$ and $R_{AP}$ may be already known values, and accordingly, the resistance value of $R_P//R_{AP}$ may also be known. Thus, by excluding the resistance value of $R_P//R_{AP}$ from the total resistance value Rtotal, the resistance value of the MTJ element $\overline{\text{MTJ}}$[d] (e.g., the target MTJ element Target) may be identified.

In some example embodiments, as a method of excluding the resistance value of $R_P//R_A$, 1) a method of flowing a static current (for example, 1 μA) and removing an effect of $R_P/R_{AP}$ by adjusting a reference voltage of a comparator (1 μA*$R_P//R_{AP}$), 2) a method of arranging a fixed resistor having a value of $R_P//R_{AP}$ and subtracting the value of $R_P//R_{AP}$ in a differential manner, 3) a method of connecting two dummy MTJ elements to $R_P$ and $R_{AP}$ in parallel respectively and subtracting the value of $R_P//R_{AP}$, and/or the like may be considered. Alternatively, as a direct comparison method, i) a method of directly comparing the total resistance value Rtotal to a fixed resistance value equal to 2*$R_P//R_{AP}$, and/or ii) a method of arranging four dummy MTJ elements to have a resistance value of $R_P//R_{AP}+R_P//R_{AP}$ and making a direct comparison may be considered.

In FIG. 7, although the MTJ element $\overline{MTJ}$[d] of the $(2i)^{th}$ bit-cell BC[2i] is selected as the target MTJ element Target, resistance values of other MTJ elements in the $i^{th}$ bit-cell pair BCP[i] may be identified in the same manner as well.

Figure 8:
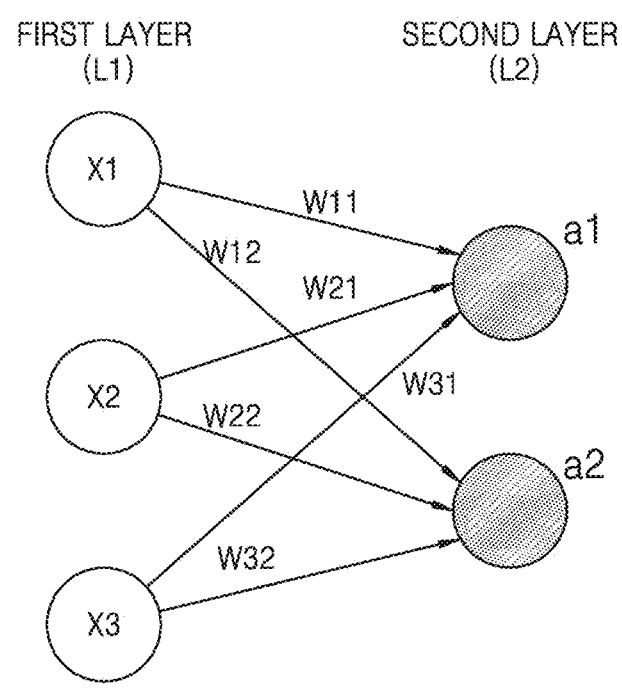
FIG. 8 is a conceptual diagram of a detailed example of a neural network.
Figure 9A:
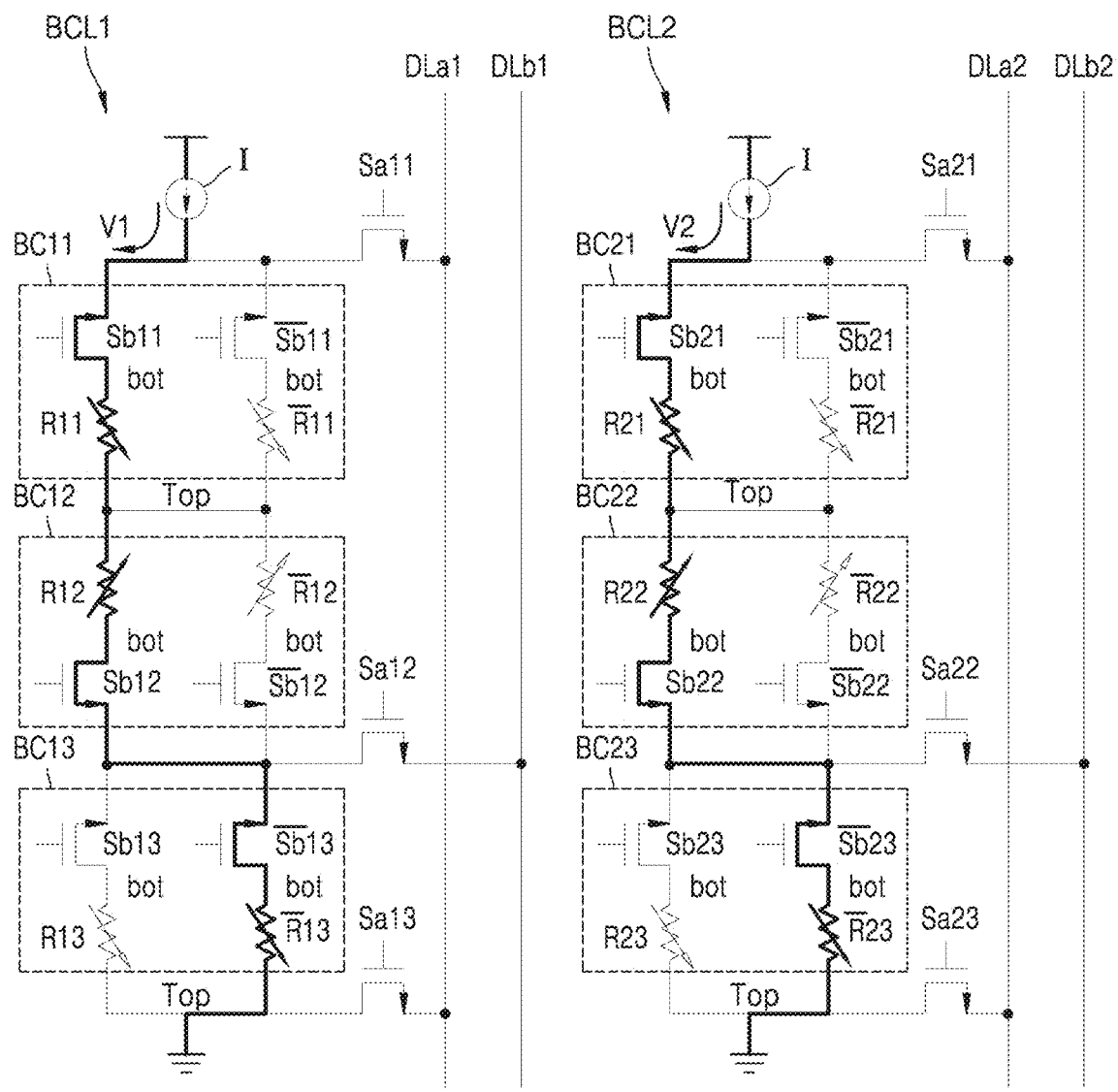
FIGS. 9A and 9B are circuit diagrams for describing operations of performing calculations required by the neural network of FIG. 8 by using the processing device of FIG. 5.
Figure 9B:
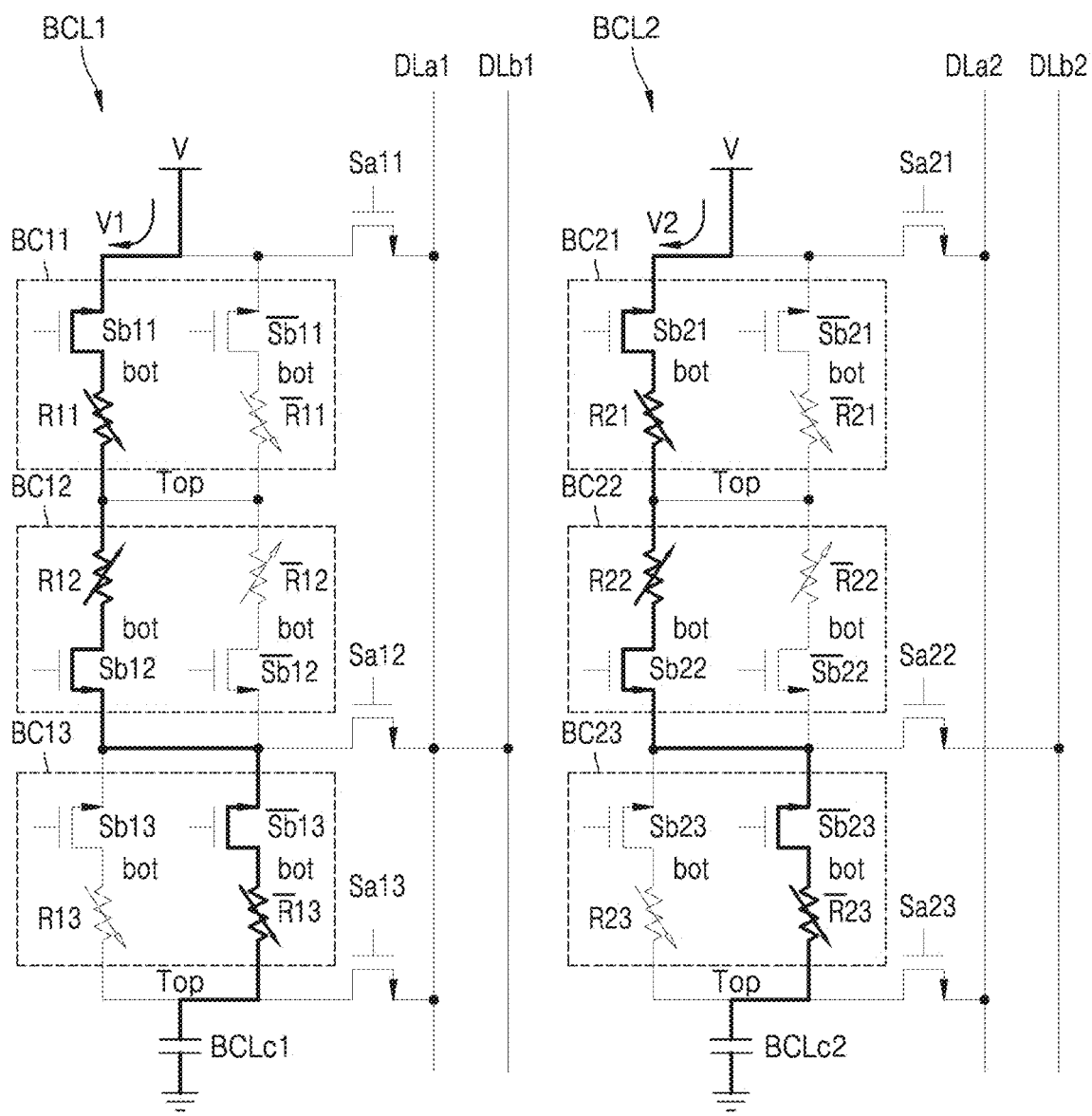

FIG. 8 is a conceptual diagram of a detailed example of a neural network, and FIGS. 9A and 9B are circuit diagrams for describing operations of performing calculations required by the neural network of FIG. 8 by using the processing device 100 of FIG. 5.

Referring to FIGS. 8 and 9A, as shown in Formula 2 below, at a first node a1 of a second layer L2, the MAC operation of performing three times multiplication operations of multiplying inputs x1, x2, and x3 (provided from nodes of a first layer L1) by weights w11, w21, and w31, respectively, and of performing an adding operation of the multiplication result values may be performed. In addition, as shown in Formula 3 below, at a second node a2 of the second layer L2, the MAC operation of performing three times multiplication operations of multiplying inputs x1, x2, and x3 (provided from nodes of the first layer L1) by weights w12, w22, and w32, respectively, and of performing an adding operation of the multiplication result values may be performed.

$a1=x1·w11+x2·w21+x3·w31$    Formula 2

$a2=x1·w12+x2·w22+x3·w32$    Formula 3

The processing device 100 of FIG. 9A may be equipped with one bit-cell pair BCP and one bit-cell BC to perform an operation required by the second layer L2 in FIG. 8. In some embodiments, though the number of inputs and weights is illustrated as three, the number of bit-cell pairs BCP and bit-cells BC may vary. In addition, when the number of the inputs and weights is even, only the bit-cell pair BCP may be equipped, but the bit-cell BC may be excluded. In addition, in the case of the MAC operation using the processing device 100 of FIG. 9A, because access switching elements Sa11, Sa12, Sa13, Sa21, Sa22, and Sa23 are maintained at an open state, the concept of the bit-cell pair BCP may not be necessary. Accordingly and for ease of description, hereinafter, the MAC operation will be described by using only the bit-cell BC.

The processing device 100 of FIG. 9A may include a first bit-cell line BCL1 including three bit-cells BC11, BC12, and BC13 connected to each other in series, and a second bit-cell line BCL2 including three bit-cells BC21, BC22, and BC23 connected to each other in series. An operation of Formula 2 required at the first node a1 in FIG. 8 may be performed on the first bit-cell line BCL1, and an operation of Formula 3 required at the second node a2 may be performed on the second bit-cell line BCL2.

When a current I of a constant value is applied to each of the first and second bit-cell lines BCL1 and BCL2, a sum of multiplication of weights and inputs applied to each of bit-cells BC11, BC12, and BC13, and BC21, BC22, and BC23 may be obtained from a sum of voltage drops occurring at each of bit-cells BC11, BC12, BC13, BC21, BC22, and BC23. The case of inputs and weights shown in Table 2 below will be described as an example.

TABLE 2

| Input | Weight (First node a1) | Weight (Second node a2) |
|---|---|---|
| x1 = 1 | w11 = 1 | w12 = −1 |
| x2 = 1 | w21 = −1 | w22 = −1 |
| x3 = −1 | w31 = −1 | w32 = 1 |

By using the weights in Table 2, the MTJ elements R11, $\overline{R}$11, R12, $\overline{R}$12, ..., R23, $\overline{R}$23 included in the processing device 100 of FIG. 9A may be set as shown in Table 3 below. For example, by using the inputs (e.g., as included in Table 2), on/off states of the bit-cell switching elements Sb11, $\overline{Sb}$11, Sb12, $\overline{Sb}$12, ..., Sb23, $\overline{Sb}$23 respectively connected to the MTJ elements R11, ..., $\overline{R}$23 in series may be set as shown in Table 4 below.

TABLE 3

| First bit-cell line BCL1 (Ω) | | Second bit-cell line BCL2 (Ω) | |
|---|---|---|---|
| R11 = 20 | $\overline{R}$11 = 5 | R21 = 5 | $\overline{R}$21 = 20 |
| R12 = 5 | $\overline{R}$12 = 20 | R22 = 5 | $\overline{R}$22 = 20 |
| R13 = 5 | $\overline{R}$13 = 20 | R23 = 20 | $\overline{R}$23 = 5 |

TABLE 4

| First bit-cell line BCL1 | | Second bit-cell line BCL2 | |
|---|---|---|---|
| Sb11 = Close | $\overline{Sb}$11 = Open | Sb21 = Close | $\overline{Sb}$21 = Open |
| Sb12 = Close | $\overline{Sb}$12 = Open | Sb22 = Close | $\overline{Sb}$22 = Open |
| Sb13 = Open | $\overline{Sb}$13 = Close | Sb23 = Open | $\overline{Sb}$23 = Close |

For example, when a current of about 1 A is provided to the first and second bit-cell lines BCL1 and BCL2 (e.g., as set in [Table 3] and [Table 4]), the current may flow toward a closed bit-cell switching element of the MTJ elements included in each bit-cell, and then, a voltage drop may occur. In this case, when a voltage is measured at an upper end of the first and second bit-cell lines BCL1 and BCL2, the measured voltage may correspond to a value to which the occurred voltage drop in each bit-cell has been added. The voltage drops occurring in the bit-cells BC11, BC12, and BC13 included in the first bit-cell line BCL1 may be as shown in [Table 5], and the voltage drops occurring in the bit-cells BC21, BC22, and BC23 included in the second bit-cell line BCL2 may be as shown in [Table 6].

TABLE 5

| | Input | Weight | Input*Weight | Resistance | Current( | Voltage( |
|---|---|---|---|---|---|---|
| First bit-cell(BC11) | 1 | 1 | 1 | 20 | 1 | 20 |
| Second bit-cell(BC12) | 1 | −1 | −1 | 5 | 1 | 5 |
| Third bit-cell(BC13) | −1 | −1 | 1 | 20 | 1 | 20 |
| First bit-cell line BCL1 | n/a | n/a | n/a | 45 | 1 | 45 |

TABLE 6

|  | Input | Weight | Input*Weight | Resistance | Current( | Voltage( |
|---|---|---|---|---|---|---|
| First bit-cell(BC21) | 1 | −1 | −1 | 5 | 1 | 5 |
| Second bit-cell(BC22) | 1 | −1 | −1 | 5 | 1 | 5 |
| Third bit-cell(BC23) | −1 | 1 | −1 | 5 | 1 | 5 |
| Second bit-cell line | n/a | n/a | n/a | 15 | 1 | 15 |

A voltage drop of about 45 V on the first bit-cell line BCL1 and a voltage drop of about 15 V on the second bit-cell line BCL2 may correspond to the MAC operation results of the weights and inputs applied to bit-cells included in each bit-cell line. For example, a relationship between the voltage drop and the MAC operation result may be represented as shown in [Table 7] below.

TABLE 7

| Voltage drop(V) | Sum of multiplications of input to weight |
|---|---|
| 15 | −3 |
| 30 | −1 |
| 45 | 1 |
| 60 | 3 |

Referring to Table 7, it may be understood that a sum of multiplications of the input to the weight applied to the first bit-cell line BCL1 is '1' from the fact that the voltage drop of the first bit-cell line BCL1 has been measured as about 45 V. In addition, it may be understood that a sum of multiplications of the input to the weight applied to the second bit-cell line BCL2 is '−3' from the fact that the voltage drop of the second bit-cell line BCL2 has been measured as about 15 V.

In FIG. 9A, each of the first and second bit-cell lines BCL1 and BCL2 includes three bit-cells as an example, but the example embodiments are not limited thereto, and one bit-cell line may include various numbers equal to or greater than one of the bit-cells. For example, one bit-cell line may include between 64 and 256 bit-cells. In addition, in FIG. 9A, as an example, the processing device 100 includes only two bit-cell lines BCL1 and BCL2, but the processing device 100 may include various number of bit-cell lines, and may include one or more bit-cell lines. The number of bit-cell lines in the processing device 100 may include between 64 and 128 bit-cell lines. In some embodiments, a plurality of bit-cells in the bit-cell line may be arranged to constitute the bit-cell array.

As described above, the processing device 100 of FIG. 9A may include an in-memory processing device which stores a value corresponding to the weight in a memory (including the MTJ element), and performs an operation using the values stored in the memory. The in-memory processing device may improve the speed of data transmission and power consumption, unlike the von Neumann structure in which the memory is separated from an operation unit. In the embodiment of FIG. 9A, a processing device is described in which a constant current I is applied to bit-cells connected to each other in series, and an operation result corresponding to a sum of multiplications from the voltage drop occurring on the bit-cell line is obtained. However, the structure including the bit-cell pair BCP in FIG. 5 may be applied to other types of processing devices.

Referring to FIGS. 8 and 9B, a processing device 100a according to some example embodiments may be different from the processing device 100 of FIG. 9A in that the processing device 100a further includes capacitors BCLc1 and BCLc2 connected in series to a lower end of each of the first and second bit-cell lines BCL1 and BCL2. The processing device 100a according to the example embodiments may include a structure including the capacitors BCLc1 and BCLc2 connected in series to the lower end of each of the first and second bit-cell lines BCL1 and BCL2, and may operate in a time to digital converter (TDC) method. For example, the TDC method may be a method of measuring a time until the voltage of each of the first and second capacitors BCLc1 and BCLc2 rises to a particular value after the voltage V is applied to each of the first and second bit-cell lines BCL1 and BCL2.

Figure 10:
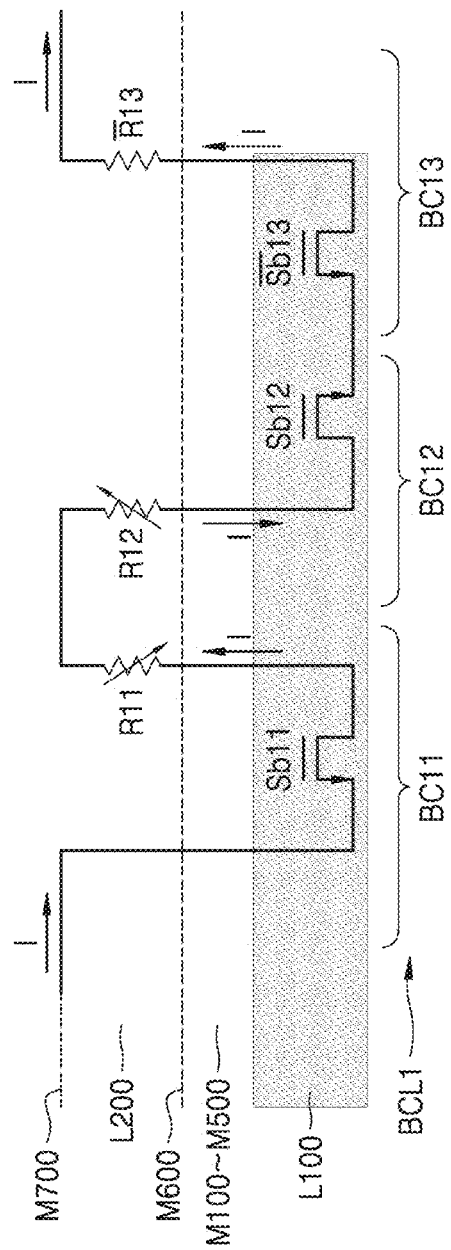
FIG. 10 is a cross-sectional view of a portion of the processing device of FIG. 5 for describing a connection relation between the MTJ element and a switching element in the circuit diagram of FIG. 9A.

FIG. 10 is a cross-sectional view of a portion of the processing device 100 of FIG. 5 for describing a connection relation between the MTJ element and the switching element in the circuit diagram of FIG. 9A, and FIG. 11 is a horizontal cross-sectional view illustrating in detail an MTJ element layer L200 in the portion of the processing device of FIG. 10.

Referring to FIG. 10, in the processing device 100 of some example embodiments, an active layer L100 in which bit-cell switching elements Sb11, Sb12, and $\overline{Sb13}$ are formed. First through sixth metal distribution layers M100 through M600, an MTJ element layer L200, and a seventh metal distribution layer M700 may be sequentially stacked on a substrate. The active layer L100 may be first formed, and by using a process of forming the first through sixth metal distribution layers M100 through M600 and the MTJ element layer L200 above the active layer L100, a position relationship between the active layer L100 and the MTJ element layer L200 may be defined.

The active layer L100 may be a layer in which the bit-cell switching elements Sb11, Sb12, $\overline{Sb13}$, and/or the like in FIG. 9A are formed, and may be a layer in which the bit-cell switching elements Sb11, Sb12, $\overline{Sb13}$, and/or the like are formed by using a transistor forming process, and/or the like on a silicon wafer. For example, the active layer L100 may be and/or may be included in a region of a silicon wafer.

In the processing device 100 of the example embodiments, the switching elements may include transistors. For convenience of description, of the switching elements Sb11, $\overline{Sb11}$, Sb12, $\overline{Sb12}$, Sb13, $\overline{Sb13}$, Sa11, Sa12, and S13 (e.g., as included in the first bit-cell line BCL1 as illustrated in FIG. 9A), only the bit-cell switching elements Sb11, Sb12, and $\overline{Sb13}$ on a route of the current I flowing through the first bit-cell line BCL1 due to the inputs and the weights in [Table 2] are illustrated. The other switching elements $\overline{Sb11}$, $\overline{Sb12}$, Sb13, Sa11, Sa12, and Sa13 (e.g., as illustrated in FIG. 9A) may be in an open state, and are not illustrated in FIG. 10 since the current I applied to the first bit-cell line BCL1 does not flow. However, the other switching elements $\overline{Sb11}$, $\overline{Sb12}$, Sb13, Sa11, Sa12, and Sa13 in FIG. 9A, which are not illustrated in FIG. 10, may also be formed in the active layer L100, and may be arranged horizontally at different locations from the switching elements Sb11, Sb12, and $\overline{Sb13}$.

The MTJ element layer L200 may include a layer in which the MTJ elements R11, R12, $\overline{R13}$, or the like in FIG. 9 are formed, the seventh metal distribution layer M700 may be arranged on the MTJ element layer L200, and the sixth metal distribution layer M600 may be arranged under the MTJ element layer L200. However, the example embodiments are not so limited, and, for example, the number of the metal distributions is not limited to seven, and in addition, the location of the MTJ element layer L200 is not limited to the above-described location. In some embodiments, the MTJ elements R11, R12, $\overline{R13}$, and/or the like may be formed in the MTJ element layer L200 in the vertical direction so that one of both ends of each MTJ element contacts the seventh metal distribution layer M700, and the other contacts the sixth metal distribution layer M600.

Hereinafter, an end portion of the MTJ elements R11, R12, $\overline{R13}$, or the like formed in the vertical direction on the side of the seventh metal distribution layer M700 may be referred to as an upper portion of the MTJ element, and that on the side of the sixth metal distribution layer M600 may be referred to as a lower portion of the MTJ element. For reference, in the processing device 100 (e.g., of FIGS. 7 and 9A), the upper portion of the MTJ element is represented as 'Top', and the lower portion thereof is represented as 'bot'.

As illustrated in FIG. 10, the current I flowing through the MTJ elements R11, R12, $\overline{R13}$, and/or the like may flow in a direction from the upper portion of the MTJ element Top to the lower portions bot thereof, and/or from the lower portion bot thereof to the upper portion Top thereof. In the MTJ element layer L200, only the MTJ element R11, R12, and $\overline{R13}$ on a route through which the current I flows due to the inputs and the weights in [Table 2] of the MTJ elements R11, $\overline{R11}$, R12, $\overline{R12}$, R13, and $\overline{R13}$ included in the first bit-cell line BCL1 in FIG. 9A are illustrated. However, although not illustrated in FIG. 10, other MTJ elements $\overline{R11}$, $\overline{R12}$, and R13 may be formed in the MTJ element layer L200, and may be arranged horizontally at different locations from the MTJ elements R11, R12, and $\overline{R13}$.

The first through seventh metal distribution layers M100 through M700 may include layers in which conductive wirings such as wirings connecting the MTJ elements $\overline{R11}$, $\overline{R12}$, and R13 to the switching elements Sb11, Sb12, and $\overline{Sb13}$, and wirings for transmitting on/off signals to the switching elements Sb11, Sb12, and $\overline{Sb13}$ are formed.

A connection relationship between the switching elements Sb11, Sb12, $\overline{Sb13}$ and the MTJ elements $\overline{R11}$, $\overline{R12}$, and R13 illustrated in FIG. 10 is described. The switching elements Sb11, Sb12, and $\overline{Sb13}$ of the first bit-cell line BCL1 may be connected respectively to corresponding MTJ elements $\overline{R11}$, $\overline{R12}$, and R13, and a bit-cell switching element Sb12 included in a second bit-cell BC12 may be connected to a bit-cell switching element $\overline{Sb13}$ included in a third bit-cell BC13 while sharing a source region and being adjacent to each other. In addition, the MTJ element R11 included in the first bit-cell BC11 may be directly adjacent to and connected to the MTJ element R12 included in the second bit-cell BC12 via the seventh metal distribution layer M700. The reason why, in this manner, the bit-cell switching elements Sb12 and $\overline{Sb13}$ are arranged adjacent to each other, and the MTJ elements R11 and R12 are arranged adjacent to each other, may be, as shown in FIG. 5 or the like, because in the processing device 100 of the embodiment, the bit-cells adjacent to each other in one direction of the bit-cell line BCL are alternately connected in series to each other in the first mirroring structure Mir1 and the second mirroring structure Mir2.

For reference, when the bit-cells are not connected to each other in one direction of the bit-cell line BCL in a mirroring structure, at least one of the bit-cell switching elements may be connected to the upper portion of the MTJ element. In this case, it may be required that a via contact for connecting one end of the corresponding bit-cell switching element to the upper portion of the MTJ element is formed between the sixth metal distribution layer M600 and the seventh metal distribution layer M700. However, when the via contact is arranged adjacent to the MTJ element, the arrangement may cause an adverse effect to characteristics of the MTJ element. Accordingly, the via contact may be arranged far from the MTJ element, and as a result, the size of the bit-cell may be increased. However, in the processing device 100 of the embodiment, because of a structure in which the bit-cells adjacent to each other in one direction of the bit-cell line BCL are connected to each other in series in the first mirroring structure Mir1 and the second mirroring structure Mir2, the via contact may not be needed and/or formed. Accordingly, the size of the bit-cell and the size of the bit-cell array may be reduced and the reliability of the MTJ element may be improved.

Referring to FIG. 11, in the processing device 100 of some example embodiments, the MTJ element layer L200 may include a plurality of bit-cell lines (e.g., four bit-cell lines BCL1 through BCL4) each including three bit-cells. For example, in FIG. 11, for describing an arrangement structure of the MTJ elements, in comparison with FIG. 9A, four bit-cell lines further including the third and fourth bit-cell lines BCL3 and BCL4 are illustrated. However, in the processing device 100 of the example embodiments, the number of bit-cell lines, and/or the number of bit-cells respectively included in bit-cell lines are not limited thereto.

As illustrated in FIG. 11, the structure of the first bit-cell line BCL1 may be substantially the same as the structure of the third bit-cell line BCL3, and in addition, the structure of the second bit-cell line BCL2 may be substantially the same as the structure of the fourth bit-cell line BCL4. Accordingly, separate reference numbers are not given to the third and fourth bit-cell lines BCL3 and BCL4.

Each bit-cell may further include a non-active MTJ elements Rd in addition to the MTJ elements. Taking the first bit-cell BC11 of the first bit-cell line BCL1 as an example, the first bit-cell BC11 may further include nine non-active MTJ elements Rd in addition to the MTJ elements R11 and $\overline{R11}$ in FIG. 9A. However, the number of the non-active MTJ elements Rd is not limited thereto, and may be greater than or less than nine. The non-active MTJ elements Rd may be MTJ elements that are not used for the processing (unlike the above-described MTJ elements R11 and $\overline{R11}$) and may not be electrically connected to the switching elements Sb11, $\overline{Sb11}$, and/or the like in FIG. 9A. The MTJ elements R11, $\overline{R11}$, and/or the like used for the processing may be referred to as active MTJ elements, as to be differentiated from the non-active MTJ elements Rd. The non-active MTJ elements Rd may be formed to implement the active MTJ elements R11, $\overline{R11}$, or the like having a uniform electrical characteristic. Due to issues in a fabrication process, the MTJ elements formed at a location where the MTJ elements are surrounded by other MTJ elements may have a relatively uniform electrical characteristic compared to the MTJ elements formed on the boundary. Accordingly, only the MTJ elements arranged at the center portion (e.g., where the reliability thereof is good) may be used for the processing, and other MTJ elements may be non-active MTJ elements that are not used.

The MTJ elements included in four bit-cells BC11, Bc12, BC21, and BC22 in FIG. 11 will be described as examples. Eleven MTJ elements may be formed in a certain one bit-cell, and a total of forty-four (44) MTJ elements may be formed in four bit-cells BC11, BC12, BC21, and BC22. In this case, the active MTJ element may be arranged at the center portion of the bit-cell and surrounded by other MTJ elements. In other words, in the four bit-cells BC11, BC12, BC21, and BC22, eight MTJ elements R11, $\overline{R}$11, R12, $\overline{R}$12, R21, $\overline{R}$21, R22, and $\overline{R}$22 arranged at locations surrounded by 36 non-active MTJ elements Rd may correspond to active MTJ elements. The distances between the MTJ elements R11, $\overline{R}$11, Rd, and/or the like may be, for example about 0.10 micrometers (μm) to about 0.40 μm. However, the distances between the MTJ elements R11, $\overline{R}^R$11, Rd, and/or the like are not limited to the above value range.

The MTJ elements in adjacent bit-cells may be arrange in upper-lower symmetrical and/or left-right symmetrical structures with a boundary line between the adjacent bit-cells as a reference. For example, the MTJ elements R11, $\overline{R}$11, and Rd may be arranged in upper-lower symmetrical structure with respect to the MTJ elements R12, $\overline{R}$12, and Rd included in the second bit-cell BC12, with the boundary line between adjacent bit-cells BC11 and BC12 as a reference. Similarly, the MTJ elements R11, $\overline{R}$11, and Rd included in the first bit-cell BC11 of the first bit-cell line BCL1 may be arranged in the left-right symmetrical structure with respect to the MTJ elements R21, $\overline{R}^R$21, and Rd included in the first bit-cell BC21 of the second bit-cell line BCL2, with the boundary line between adjacent bit-cells BC11 and BC21 as a reference.

Figure 12A:
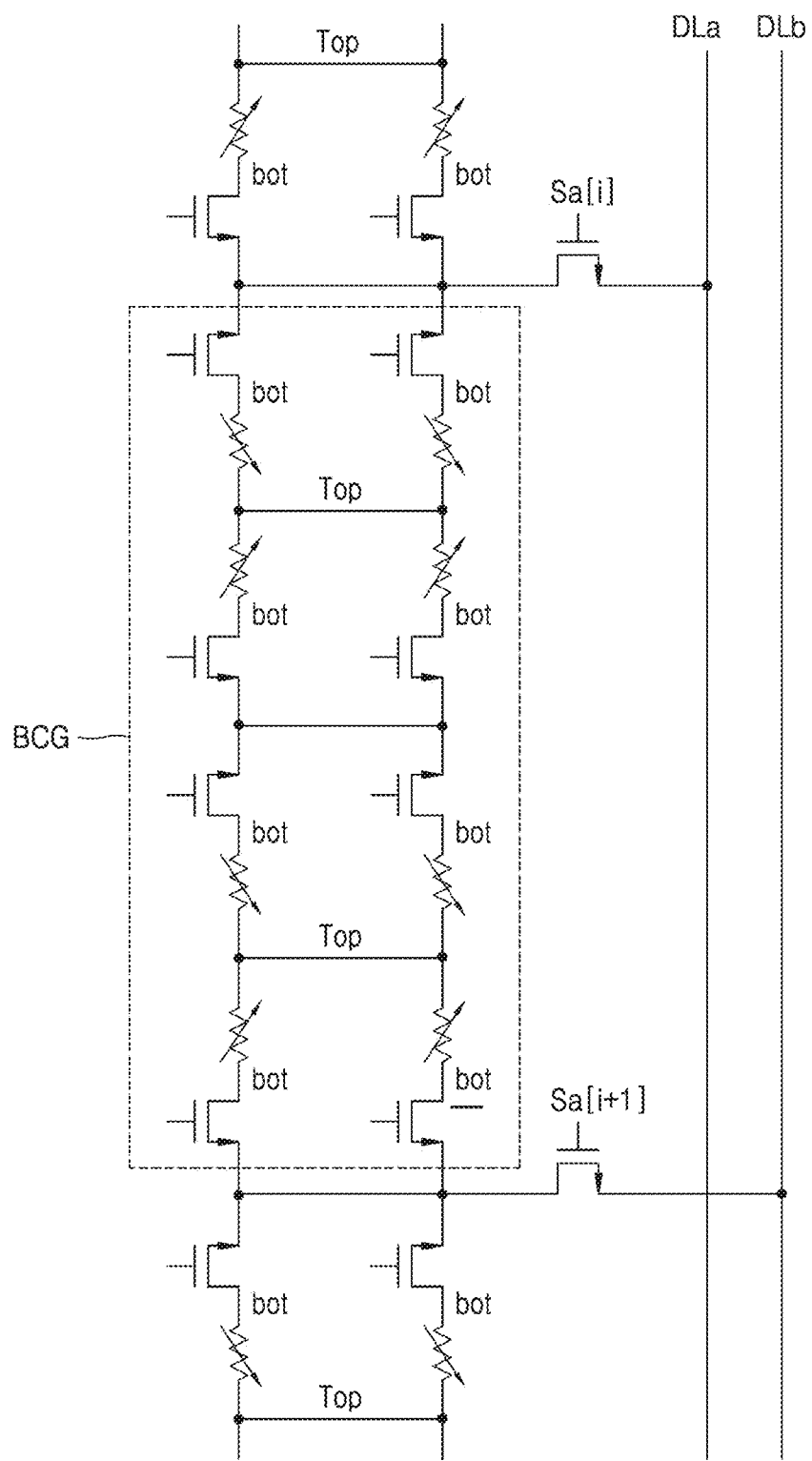
FIGS. 12A and 12B are circuit diagrams of bit-cell pairs included in processing devices, according to some example embodiments.
Figure 12B:
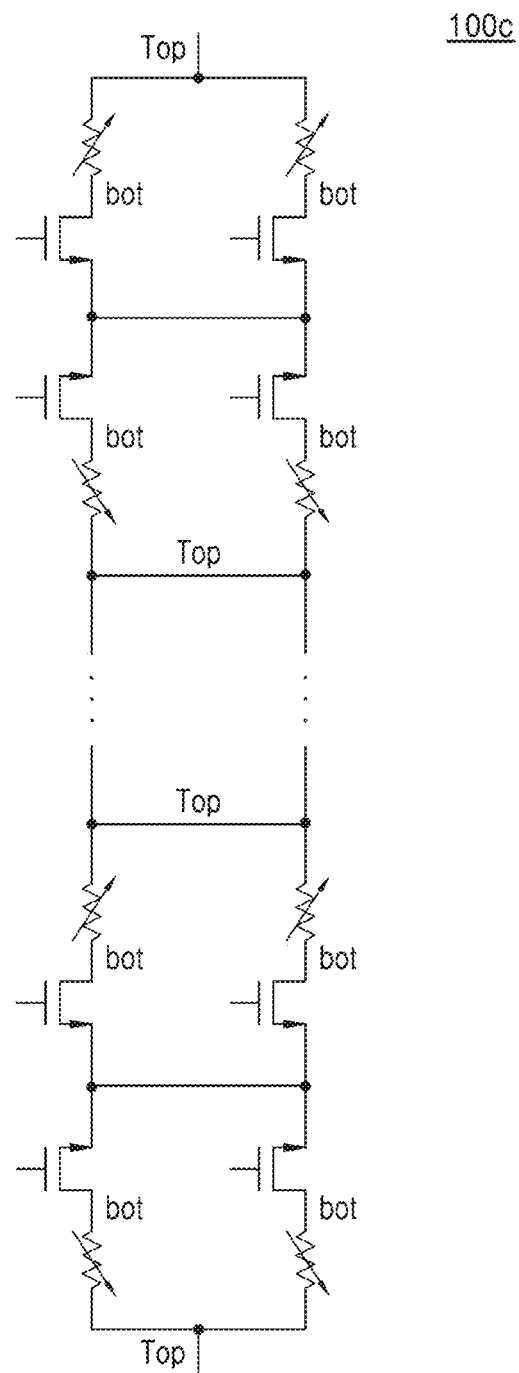

FIGS. 12A 12B are circuit diagrams of bit-cell pairs included in processing device 100b and 100c, according to some example embodiments.

Referring to FIGS. 12A and 12B, the processing device 100b of the example embodiments may, based on the above-described mirroring structure and the simultaneous write operation on two MTJ elements, expand the bit-cell pair into a structure of a bit-cell group BCG including 2m (where m is a natural number equal to or greater than 2) of bit-cells. Even in this bit-cell group BCG, the bit-cells adjacent to each other therein may have the mirroring structure, and in addition, the bit-cells adjacent to each other between adjacent bit-cell groups BCG to each other may also have a mirroring structure. For example, in the case where m is 2, the processing device 100b may have a structure in which the bit-cell group BCG includes four bit-cells as illustrated in FIG. 12A. For convenience of illustration, in FIGS. 12A and 12B numbers for the MTJ element and the bit-cell switching element are omitted. In addition, in FIGS. 12A and 12B, and as noted above, the 'Top' and the 'bot' may respectively denote the upper portion and the lower portion of the MTJ element.

As seen from FIG. 12A, the number of the access switching elements may be further reduced as compared to a structure of the bit-cell pair BCP including two bit-cells. For example, because one access switching element is arranged per bit-cell group BCG, the number of access switching elements may be reduced by half again compared to the structure of the bit-cell pair BCP. When the bit-cell line is generalized to the case of including 2n (n is a natural number), an even number, of bit-cells, and when the bit-cell group BCG is assumed to include 2l (where l is a natural number less than n) of the bit-cells, the number of access switching elements may be reduced to ceil(2n/l+1). In this case, ceil may represent a ceiling function, and ceil(x) may indicate a minimum integer equal to or greater than x.

In some embodiments, considering an aspect of the write operation of the MTJ element, even for the case of four MTJ elements, the write operation for the MTJ element may be performed for all cases by properly combining the bit-cell switching elements. A continuous expansion may be possible, e.g., for m=3, 4, 5, . . . , etc. and in the end, there may be the case where 2m becomes a maximum value 2n (where 2n is equal to the number of total rows of the bit-cell line). In this case, like the processing device 100c illustrated in FIG. 12B, separate data lines and access switching elements for write/read operations may not be necessary, and a structure in which only bit-cells are connected to each other in series may result in.

Considering an aspect of the read operation, a method in which all the MTJ elements of remaining bit-cells, except for the bit-cells including the target MTJ elements on the route, are connected to each other in parallel may be considered. In this case, the resistance value of $R_P//R_{AP}$ in series may be read (n−1) times, and accordingly, the resistance value of the target MTJ element Target may be read by using a method similar to the method described above with reference to FIG. 7.

Figure 13A:
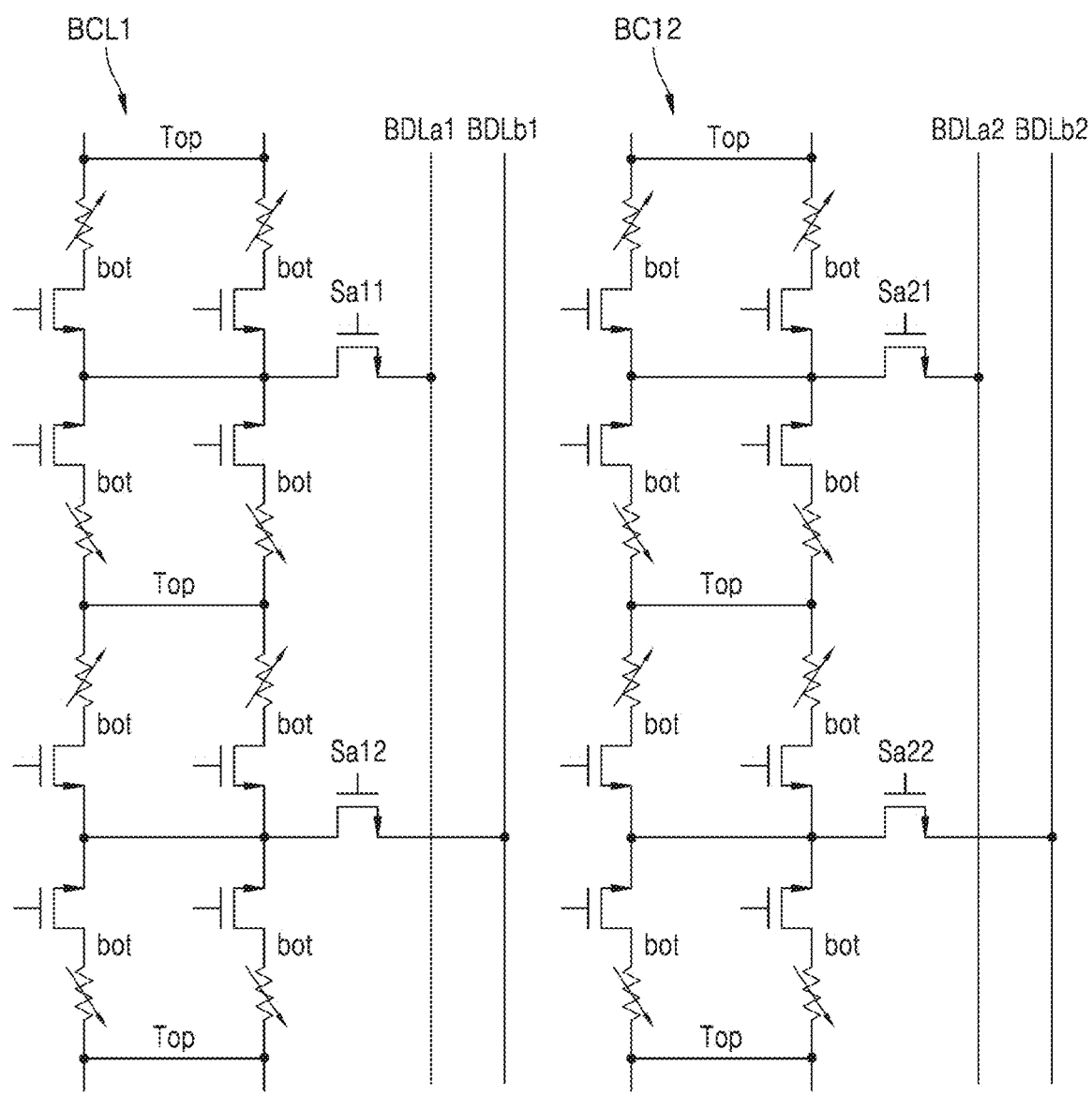
FIGS. 13A and 13B are circuit diagrams illustrating an individual structure and a shared structure of bit-cell lines included in a processing device, according to some example embodiments.
Figure 13B:
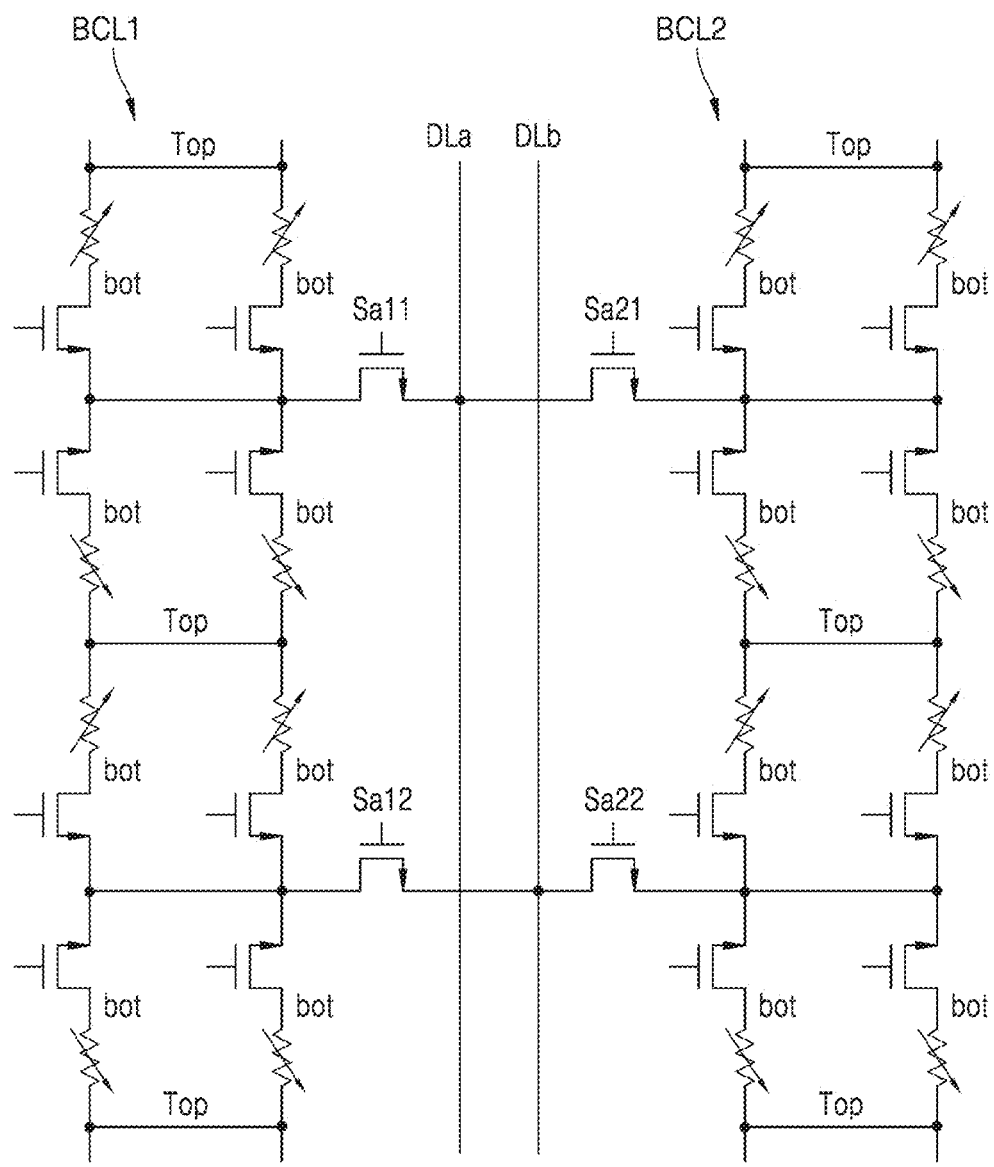

FIGS. 13A and 13B are circuit diagrams illustrating an individual structure and a shared structure of bit-cell lines included in processing devices 100 and 100d, according to some example embodiments.

Referring to FIGS. 13A and 13B, in the processing device 100 of the example embodiments, one bit-cell line BCL may connected to two separate data lines for the read/write operations. For example, the MTJ element may be programmed by applying a '+' or '−' voltage via two data lines in the write operation, and/or the state of the MTJ element (e.g., the resistance value) may be read via the same data lines. For example, as illustrated in FIG. 13A, the read/write operations may be performed on the first bit-cell line BCL1 via two first data lines BDLa1 and BDLb1, and the read/write operations may be performed on the second bit-cell line BCL2 via two second data lines BDLa2 and BDLb2. For reference, in FIGS. 13A and 13B, for convenience of description, reference numbers for the MTJ element and the bit-cell switching element are omitted, and the 'Top' and the 'bot' may indicate the upper portion and the lower portion of the MTJ element, respectively.

As described above, in the processing device 100 of the example embodiments, based on the mirroring structure of adjacent bit-cells, the via contact may not be necessary and the size of the bit-cell may be reduced. However, when the size of the bit-cell is reduced, a limit of a space for distribution routing may occur. Accordingly, as a method for reducing the number of distribution lines, as illustrated in FIG. 13B, a processing device 100d of the embodiment may have a structure in which the two adjacent bit-cell lines BCL1 and BCL2 share two distribution lines DL1 and DLb. In this structure of sharing the distribution lines, by sequentially selecting row and/or bit-cell pair by using the access switching element, and selecting a direction of supplying a voltage via the distribution lines, a value of '0' or '1' may be programmed to the corresponding MTJ element.

For example, it may be possible to perform the same operation (for example, writing '1') to two bit-cell lines BCL1 and BCL2 which share two distribution lines DLa and DLb and are adjacent to each other. As a result, a structure in which two distribution lines per bit-cell line are routed may be changed to a structure in which two distribution lines per two bit-cell lines are routed based the shared structure of the distribution lines DLa and DLb. Therefore, in some example embodiments, only one distribution line may be required per one bit-cell line. Accordingly, in the processing device 100d of the example embodiments, the number of distribution lines may be reduced, and the size of the bit-cell array including the distribution lines may be reduced.

Figure 14:
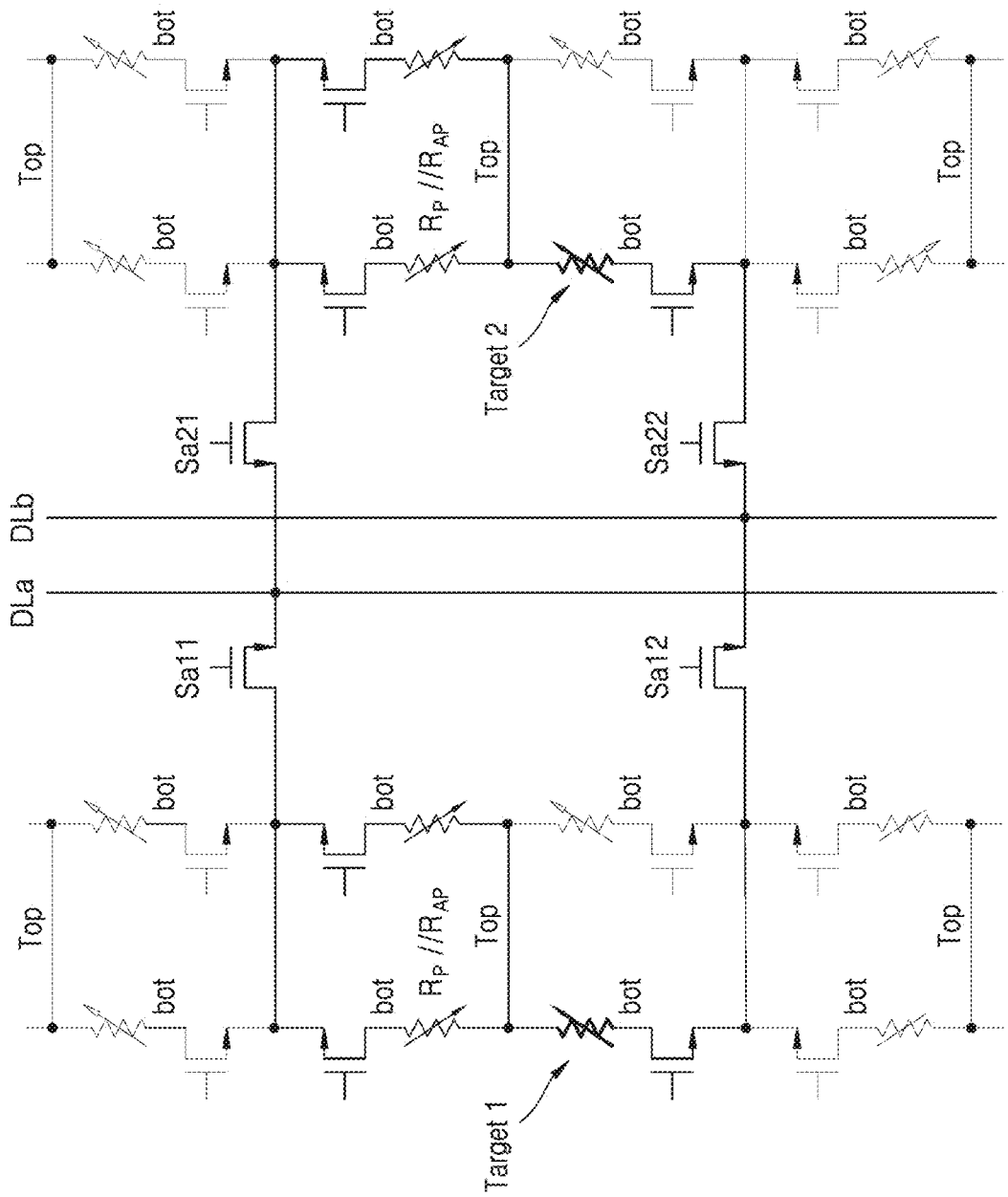
FIG. 14 is a circuit diagram for describing a read operation in the shared structure of the bit-cell lines of FIG. 13B.

FIG. 14 is a circuit diagram for describing a read operation in the shared structure of the bit-cell lines in FIG. 13B.

Referring to FIG. 14, the read operation in a structure, as illustrated in FIG. 13B, in which the two adjacent bit-cell lines share two data lines will be considered. For reference, in FIG. 14, for convenience of illustration, reference numbers for the MTJ element and the bit-cell switching element are omitted, and, as noted above, the 'Top' and the 'bot' may denote the upper portion and the lower portion of the MTJ element, respectively.

In a structure in which the data lines are shared, because the MTJ elements of the bit-cell line on both sides are simultaneously read, as illustrated below, there may be a limit. First, the case in which a first target MTJ element Target1 and a second target MTJ element Target2 are both in a state of '1', for example, $R_{AP}$, or both in a state of '0', for example, $R_P$ may be relatively easily read. In each case, the total resistance value Rtotal may be read as below.

i) when both have $R_P$: Rtotal=$1/2*(R_P//R_{AP}+R_P)$
ii) when both have $R_{AP}$: Rtotal=$1/2*(R_P//R_{AP}+R_P)$ However, in the case where the first target MTJ element Target1 is in a different state from the second target MTJ element Target 2, a value below may be read, but it may be difficult and/or impossible to know an MTJ element on which line of the two bit-cell lines is $R_P$ or $R_{AP}$. In this case, the total resistance value Rtotal may be read as below.

iii) when both have different values from each other: Rtotal=$(R_P//R_{AP}+R_P)//(R_P//R_{AP}+R_{AP})$ For example, in a structure in which the data lines are shared, information may be obtained for the cases of i) when both have $R_{AP}$, ii) when both have $R_P$, and iii) when both have different values from each other.

Figure 15:
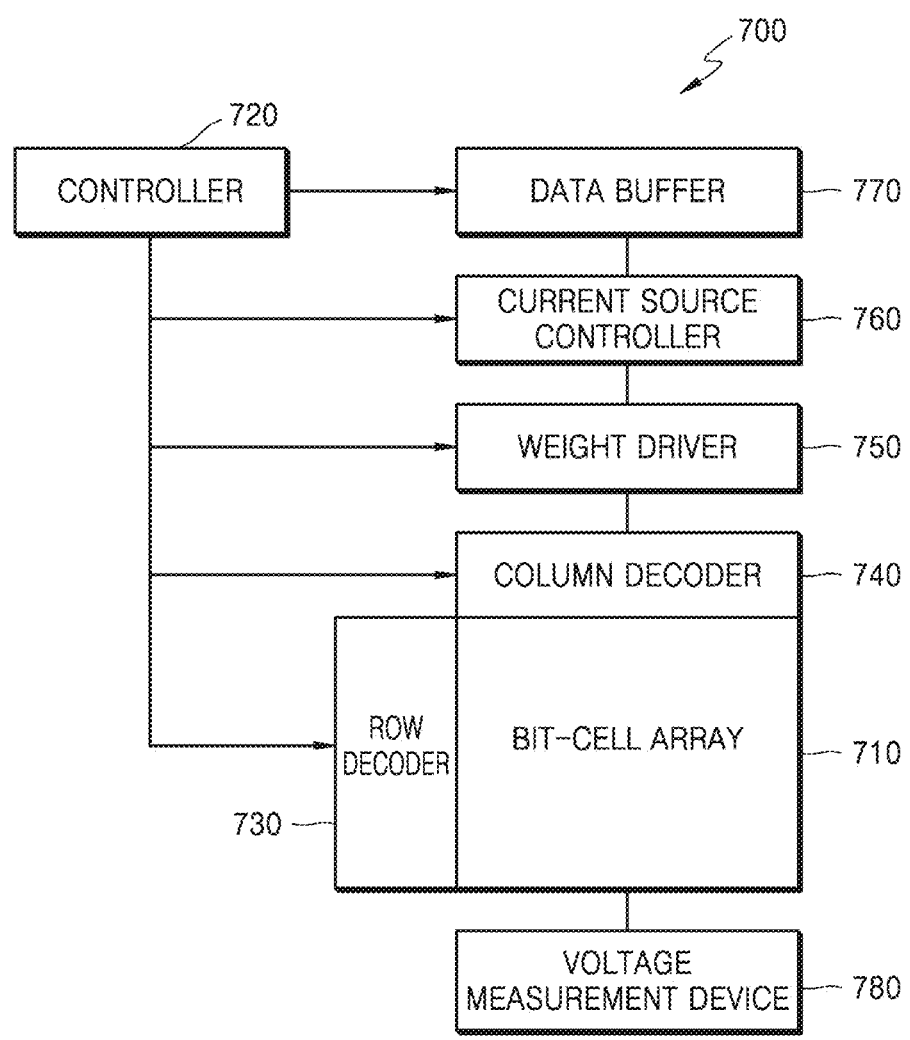
FIG. 15 is a block structure diagram of a processing device, according to some example embodiments.

FIG. 15 is a block structure diagram of a processing device 700, according to some example embodiments.

Referring to FIG. 15, the processing device 700 of the example embodiments may include a bit-cell array 710, a controller 720, a row decoder 730, a column decoder 740, a weight driver 750, a current source 760, a data buffer 770, and a voltage measurement device 780. In addition, the processing device 700 according to the example embodiments may further include other general components in addition to those illustrated in FIG. 15.

The bit-cell array 710 may include an array of bit-cells including the above-described MTJ elements and switching elements.

The controller 720 may decode commands necessary for driving and operating the processing device 700. For example, the controller 720 may decode commands for setting the weights, a weight setting inspection, an application of an input, measuring voltages, and/or the like, and, in some embodiments, may transmit signals to components needed for performing these commands (e.g., as described below).

The row decoder 730 may receive a row address and an input signal, and apply an input value to the bit-cell array 710. The row decoder 730 may include, for example, a digital to analog converter (DAC) or an analog-to-digital converter (ADC), and may apply a driving voltage to the switching element connected to the MTJ in series based on the input value. In addition, the row decoder 730 may change the resistance value of the MTJ element included in the bit-cell array 710 in the bit-cell array 710, and in this case, may apply the driving voltage to the related switching element so that a target MTJ element is selected.

The column decoder 740 may receive a column address and a weight setting signal, and apply a current/voltage to the MTJ element. The column decoder 740 may select the bit-cell line required for voltage measurement and the weight line connected to the bit-cell requiring the weight setting.

The weight driver 750 may transmit a piece of weight data to the bit-cell selected by the row decoder 730 and the column decoder 740 when a weight is set. The weight driver 750 may drive the weight line connected to the column decoder 740 based on data received from the data buffer 770, and perform setting the weight and an inspection of the set weight. The weight driver 750 may include a current source applying an inspection current to the weight line, for inspecting whether the required resistance value has been set to the MTJ element.

The current source controller 760 may receive a signal of the controller 720 to drive the current source, and apply a current to the bit-cell line.

The voltage measurement device 780 may measure a voltage of a capacitor connected to the bit-cell line or one end of the bit-cell line, and store a measured value to an external memory (not illustrated). The voltage measurement device 780 may include the ADC outputting the measurement value as a digital value.

In some embodiments, the functional elements configured to perform and/or decode a task and/or command (e.g., the controller 720, the column decoder 740, the weight driver, 750, and/or the current source controller 760) may include processing circuitry such as hardware including logic circuits; a hardware/software combination such as a processor executing software; or a combination thereof. For example, the processing circuity more specifically may include and/or be included in, but is not limited to, a central processing unit (CPU), an arithmetic logic unit (ALU), a digital signal processor, a microcomputer, a field programmable gate array (FPGA), and programmable logic unit, a microprocessor, application-specific integrated circuit (ASIC), etc.

Figure 16:
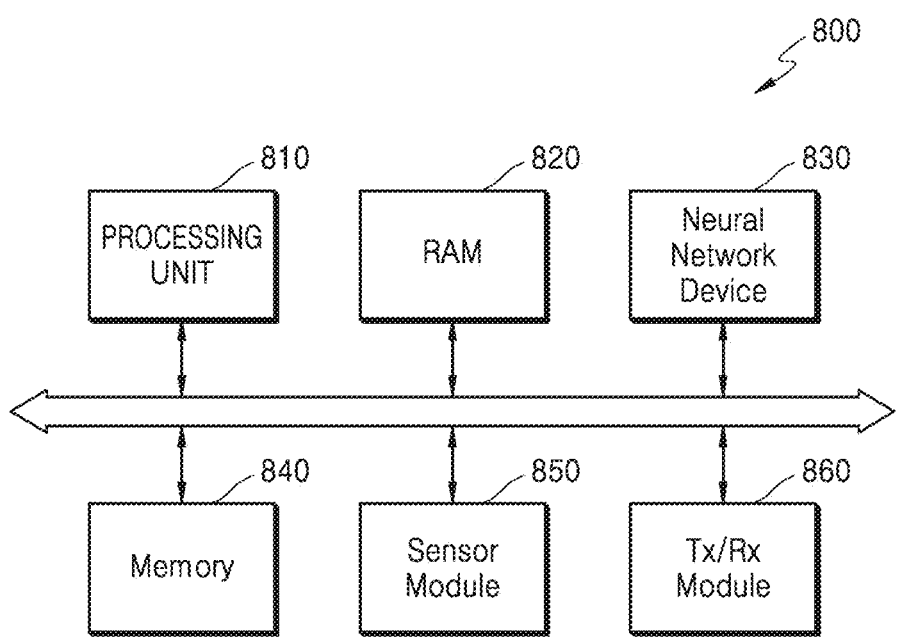
FIG. 16 is a block structure diagram of an electronic system including a processing device according to some example embodiments.

FIG. 16 is a block structure diagram of an electronic system 800 including a processing device 810, according to some example embodiments.

Referring to FIG. 16, the electronic system 800 may extract information by analyzing input data based on the neural network device 830 including a processing device (e.g., as described above), and determine the state based on the extracted information, and/or control components of an electronic device on which the electronic system 800 is mounted. For example, the electronic system 800 may be applied to a robotic device such as a drone and/or to an advanced drivers assistance system (ADAS), a smart TV, a smart phone, a medical device, a mobile device, an image display device, a measurement device, an Internet of Things (IoT) devices, and/or the like. In addition, the electronic system 800 may be mounted on and/or included in various kinds of electronic devices.

The electronic system 800 may include, in addition to the neural network device 830, a processing unit 810, a random access memory (RAM) 820, a memory 840, a sensor module 850, and/or a communication module (Tx/Rx module) 860. In addition, the electronic system 800 may further include an input/output module, a security module, a power controller, etc. A portion of hardware components of the electronic system 800 may be mounted as a semiconductor chip. The neural network device 830 may include a processing device of above-described embodiments implemented in an on-chip type, or may include a device including the processing device of above-described embodiments as a portion of the neural network device 830.

The processing unit 810 may control all operations of the electronic system 800. The processing unit 810 may include, for example, a central processing unit (CPU), and may include one single core or a plurality of multi-cores. The processing unit 810 may process and/or execute programs and/or data stored in the memory 840, and by executing the programs stored in the memory 840, may control functions of the neural network device 830. In some embodiments, the processing unit 810 may be implemented in a graphics processing unit (GPU), an application processor (AP), or the like in addition to the CPU.

The RAM 820 may temporarily store programs, data, and/or instructions. For example, the programs and/or data stored in the memory 840 may be temporarily stored in the RAM 820 according to a control and/or a booting code of the processing unit 810. The RAM 820 may be implemented in and/or as memory devices such as dynamic RAM (DRAM) and static RAM (SRAM).

The neural network device 830 may perform an operation of the neural network based on the received input data, and may generate an information signal based on the result of the operation. The neural network device 830 may include the processing device of the above-described embodiments. The neural network device 830 may include a convolution neural network (CNN), a recurrent neural network (RNN), a deep belief network, a restricted Boltzman machine, or the like in addition to the DNN, but is not limited thereto. The neural network device 830 may correspond to a hardware accelerator dedicated for the neural network.

The information signal may include various kinds of recognition signals such as an audio recognition signal, an object recognition signal, an image recognition signal, a biometric information recognition signal, and/or the like. For example, the neural network device 830 may receive frame data included in a video stream and/or audio data included in an audio stream as input data, and generate a recognition signal for an object included in the image represented by the frame data and/or the sound represented by the audio data. The neural network device 830 may receive various types of input data according to a type or function of an electronic device mounted thereon, and may generate the recognition signal according to an input data.

The memory 840 may, as a storage area for storing data, store an operating system (OS), various programs, and various data. The memory 840 may include a volatile memory and/or a non-volatile memory.

The sensor module 850 may collect information about the periphery of an electronic device on which the electronic system 800 is mounted. The sensor module 850 may include various types of sensing devices, and may sense or receive signals (for example, an image signal, an audio signal, a magnetic signal, a biometric signal, a touch signal, and/or the like) from the outside of an electronic device, and convert the sensed or received signals to data. In addition, the sensor module 850 may provide the converted data to the neural network device 830 as input data. In some embodiments, the sensor module 850 may further include a user interface device, as described below.

The communication module 860 may include various wired or wireless interfaces capable of communicating with external devices. For example, the communication module 860 may facilitate communication between the electronic system 800 and a network.

The electronic system 800 may further include a user interface device such as a touch panel, a key, and a button, as well as a processor, a memory device storing and executing a program data, a permanent storage such as a disk drive, and a communication port communicating with an external device. Methods implemented as a software module or an algorithm may be stored on a computer-readable recording medium as computer-readable codes or program commands executable in a processor.

While the inventive concepts have been particularly shown and described with reference to embodiments thereof, it will be understood that various changes in form and details may be made therein without departing from the spirit and scope of the following claims.

What is claimed is:

1. A processing device based on a magnetic tunnel junction (MTJ) element comprising:
    at least one bit-cell line on which a plurality of bit-cells are connected to each other in series,
    wherein each of the bit-cells comprises
        a first MTJ element configured to be switched between different resistance states and to be programmed with a resistance value,
        a second MTJ element configured to be switched between different resistance states and to be programmed with a resistance value,
        a first switching element connected to the first MTJ element in series and configured to switch an application of at least one of a current or a voltage to the first MTJ element, and
        a second switching element connected to the second MTJ element in series and configured to switch an application of at least one of a current or a voltage to the second MTJ element,
    wherein the second switching element is configured to perform a switching complementary to the first switching element, and
    wherein, on the bit-cell line, two adjacent bit-cells among the plurality of bit-cells are connected to each other in series in a mirroring structure.

2. The processing device of claim 1, wherein
    the first MTJ element and the second MTJ element, of a $(2i-1)^{th}$ bit-cell of the at least one bit-cell line (where i represents a natural number), are adjacent to and connected in series to the first MTJ element and the second MTJ element of a $(2i)^{th}$ bit-cell of the at least one bit-cell line, and
    the first switching element and the second switching element of the $(2i)^{th}$ bit-cell of the bit-cell line are adjacent to and connected in series to the first switching element and the second switching element of a $(2i+1)^{th}$ bit-cell of the at least one bit-cell line.

3. The processing device of claim 2, wherein
    the first switching element and the second switching element each comprise transistors, and
    the first switching element and the second switching element of the $(2i)^{th}$ bit-cell of the at least one bit-cell line respectively share a source region with the first switching element and the second switching element of the $(2i+1)^{th}$ bit-cell of the at least one bit-cell line.

4. The processing device of claim 2, further comprising:
    at least two third switching elements between the bit-cell line and a data line for programming,
    wherein, when the bit-cell line comprises an even number of bit-cells,
        the $(2i-1)^{th}$ bit-cell and the $(2i)^{th}$ bit-cell constitute a bit-cell pair,
        a number of the third switching elements is greater than a number of the bit-cell pairs by one, and
        one of the bit-cell pairs is between two adjacent third switching elements, or wherein, when the bit-cell line comprises an odd number of bit-cells, at least one of the (2i−1)$^{th}$ bit-cell and the (2i)$^{th}$ bit-cell, or the (2i)$^{th}$ bit-cell and the (2i+1)$^{th}$ bit-cell constitute a bit-cell pair, a first bit-cell or a last bit-cell does not constitute a bit-cell pair, and a number of the third switching elements is greater than a number of the bit-cell pairs by two, and at least one of the bit-cell pairs, the first bit cell, or the last bit-cell is between the two adjacent third switching elements.

5. The processing device of claim 4, wherein at least one of the first MTJ element and the second MTJ element of the first bit-cell of the bit-cell pair, and at least one of the first MTJ element and the second MTJ element of a second bit-cell of the bit-cell pair are simultaneously and complementarily programmed in a vertical write or diagonal write type.

6. The processing device of claim 5, wherein, when the resistance values of the first MTJ element and the second MTJ element of the first bit-cell are respectively referred to as R11 and R12, the resistance values of the first MTJ element and the second MTJ element of the second bit-cell are referred to as R21 and R22, respectively, and each of R11, R12, R21, and R22 corresponds to 1 or 0, a matrix comprising the R11, R12, R21, and R22 as elements has any one pattern of $$\begin{bmatrix} 1 & 0 \\ 0 & 1 \end{bmatrix}, \begin{bmatrix} 0 & 1 \\ 1 & 0 \end{bmatrix}, \begin{bmatrix} 0 & 1 \\ 0 & 1 \end{bmatrix}, \text{ and } \begin{bmatrix} 1 & 0 \\ 1 & 0 \end{bmatrix}.$$

7. The processing device of claim 1, wherein each of the bit-cells is configured to perform an XNOR operation using the resistance values of the first MTJ element and the second MTJ element and switching operations of the first switching element and the second switching element, and the bit-cell line is configured to perform a multiply accumulate (MAC) operation including multiplication operations and an adding operation of results of the multiplication operations.

8. The processing device of claim 1, wherein the at least one bit-cell line includes a plurality of bit-cell lines, and two adjacent bit-cell lines, of the plurality bit-cell lines, share a data line for programming the first MTJ element and the second MTJ element.

9. The processing device of claim 1, further comprising:

at least two third switching elements between the bit-cell line and a data line for programming the first MTJ element and the second MTJ element, wherein the bit-cell line comprises 2n (where n represents a natural number) of bit-cells sequentially connected to each other in series, and wherein 2m (where m represents a natural number less than n) of the bit-cells constitute a bit-cell group.

10. The processing device of claim 1, further comprising:

a substrate including an active region and at least two metal distribution layers on the active region, wherein the first switching element and the second switching element are included in the active region, and the first MTJ element and the second MTJ element of each of the bit-cells are arranged between a first upper metal layer and a second upper metal layer of the at least two metal distribution layers.

11. The processing device of claim 10, wherein there is no via contact between the first upper metal layer and the second upper metal layer.

12. A processing device based on a magnetic tunnel junction (MTJ) element comprising:

a substrate;

an active layer on the substrate, the active layer comprising a plurality of switching elements;

at least two metal distribution layers on the active layer, the at least two metal distribution layers including a first upper metal layer and a second upper metal layer;

an MTJ element layer between the first upper metal layer and the second upper metal layer; and at least one bit-cell line on which a plurality of bit-cells are connected to each other in series, wherein each of the bit-cells comprises a first MTJ element on the MTJ element layer, a second MTJ element on the MTJ element layer and connected to the first MTJ element in parallel, a first switching element in the active layer and connected to the first MTJ element in series, and a second switching element in the active layer and connected to the second MTJ element in series, the first MTJ element and the second MTJ element are programmed with complementary resistance values to each other, the first switching element and the second switching element are configured to switch complementarily to each other and to, respectively, apply at least one of a current or a voltage to the first MTJ element and the second MTJ element, and on the at least one bit-cell line, two adjacent bit-cells among the plurality of bit-cells are connected to each other in series in a mirroring structure, the mirroring structure including a first mirroring of the first switching element and the second switching element, and a second mirroring of the first MTJ element and the second MTJ element, and the first mirroring and the second mirroring are alternately repeated between the two adjacent bit-cells in one direction of the at least one bit-cell line.

13. The processing device of claim 12, wherein a (2i−1)$^{th}$ bit-cell of the at least one bit-cell line (where i represents a natural number) is connected to a (2i)$^{th}$ bit-cell cell of the at least one bit-cell line in series in the second mirroring, the (2i)$^{th}$ bit-cell of the at least one bit-cell line is connected to a (2i+1)$^{th}$ bit-cell of the at least one bit-cell line in series in the first mirroring, when the bit-cell line comprises an even number of bit-cells, the (2i−1)$^{th}$ bit-cell and the (2i)$^{th}$ bit-cell comprise a bit-cell pair, or when the bit-cell line comprises an odd number of bit-cells, at least one of the (2i−1)$^{th}$ bit-cell and the (2i)$^{th}$ bit-cell or the (2i)$^{th}$ bit-cell and the (2i+1)$^{th}$ bit-cell comprise a bit-cell pair, and at least one of the first MTJ element and the second MTJ element of a first bit-cell of the bit-cell pair, and one of the first MTJ element and the second MTJ element of a second bit-cell of the bit-cell pair are programmed with complementary resistance values to each other.

14. The processing device of claim 13, further comprising:

at least two third switching elements between the bit-cell line and a data line for programming the first MTJ element and the second MTJ element, wherein the at least two third switching elements comprises a number of third switching elements greater than a number of the bit-cell pairs by one or two,
one of the bit-cell pair is between two adjacent third switching elements, and
at least one of the first MTJ element or the second MTJ element of the first bit-cell, and one of the first MTJ element or the second MTJ element of the second bit-cell are configured to be programmed simultaneously and complementarily according to a current flow.

15. The processing device of claim 12, wherein
the at least one bit-cell line includes a plurality of bit-cell lines,
wherein each of the bit-cells is configured to perform an XNOR operation,
each of the bit-cell lines is configured to perform a multiply accumulate (MAC) operation, and
the bit-cell lines constitute a neural network in a two-dimensional bit-cell array type.

16. The processing device of claim 12, wherein there is no via contact between the first upper metal layer and the second upper metal layer.

17. The processing device of claim 12, wherein the processing device is configured to perform in-memory processing.

18. The processing device of claim 12, further comprising:
a plurality of non-active MTJ elements, not connected to either of the first or second switching elements, on the MTJ element layer, and
wherein, in each of the bit-cells, the first MTJ element and the second MTJ element are in a center portion of the bit-cell, in a plan view, and the non-active MTJ elements are in a boundary portion of the bit-cell, the boundary portion surrounding the center portion in the plan view.

19. An electronic system comprising:
a processing device based on a magnetic tunnel junction (MTJ) element;
a processing unit configured to control an operation of the processing device; and
a memory unit configured to store at least one of programs, data, or commands to be used in the operation of the processing device,
wherein the processing device comprises at least one bit-cell line on which a plurality of bit-cells are connected to each other in series,
wherein each of the bit-cells comprises
a first MTJ element configured to be switched between different resistance states and to be programmed with a resistance value;
a second MTJ element connected to the first MTJ element in parallel, the second MTJ element configured to be switched between different resistance states and to be programmed with a resistance value complementary to the resistance value of the first MTJ element;
a first switching element connected to the first MTJ element in series and configured to switch an application of at least one of a current or a voltage to the first MTJ element; and
a second switching element connected to the second MTJ element in series and configured to switch an application of at least one of a current or a voltage to the second MTJ element,
wherein the second MTJ element is configured to perform a switching operation complementary to the first switching element, and
wherein, on the bit-cell line, two adjacent bit-cells among the plurality of bit-cells are connected to each other in series in a mirroring structure.

20. The electronic system of claim 19, wherein
the first MTJ element and the second MTJ element, of a $(2i-1)^{th}$ bit-cell of the at least one bit-cell line (where i represents a natural number), are adjacent to and connected in series to the first MTJ element and the second MTJ element of a $(2i)^{th}$ bit-cell of the at least one bit-cell line,
the first switching element and the second switching element of the $(2i)^{th}$ bit-cell of the at least one bit-cell line are adjacent to and connected in series to the first switching element and the switching element of a $(2i+1)^{th}$ bit-cell of the at least one bit-cell line,
wherein, when the at least one bit-cell line comprises an even number of the bit-cells, the $(2i-1)^{th}$ bit-cell and the $(2i)^{th}$ bit-cell constitute a bit-cell pair, or when the at least one bit-cell line comprises an odd number of the bit-cells, at least one of the $(2i-1)^{th}$ bit-cell and the $(2i)^{th}$ bit-cell or the $(2i)^{th}$ bit-cell and the $(2i+1)^{th}$ bit-cell constitute a bit-cell pair, and
wherein at least one of the first MTJ element or the second MTJ element of a first bit-cell of the bit-cell pair, and one of the first MTJ element or the second MTJ element of a second bit-cell of the bit-cell pair are configured to be programmed with complementary resistance values to each other.

* * * * *